United States Patent
He et al.

(10) Patent No.: US 12,200,974 B2
(45) Date of Patent: Jan. 14, 2025

(54) DISPLAY PANEL AND DISPLAY DEVICE

(71) Applicant: Xiamen Tianma Micro-Electronics Co., Ltd., Xiamen (CN)

(72) Inventors: Shui He, Xiamen (CN); Ping An, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 488 days.

(21) Appl. No.: 17/451,356

(22) Filed: Oct. 19, 2021

(65) Prior Publication Data

US 2022/0254851 A1 Aug. 11, 2022

(30) Foreign Application Priority Data

Feb. 5, 2021 (CN) .......................... 202110164011.3

(51) Int. Cl.
| | |
|---|---|
| *H01L 27/32* | (2006.01) |
| *H01L 29/786* | (2006.01) |
| *H10K 59/121* | (2023.01) |
| *H10K 59/126* | (2023.01) |
| *H10K 59/131* | (2023.01) |

(52) U.S. Cl.
CPC ..... *H10K 59/1213* (2023.02); *H01L 29/7869* (2013.01); *H10K 59/126* (2023.02); *H10K 59/131* (2023.02)

(58) Field of Classification Search
CPC ............. H10K 59/1213; H10K 59/126; H10K 59/131; H01L 29/7869; H01L 27/1251; H01L 27/1225
See application file for complete search history.

(56) References Cited

U.S. PATENT DOCUMENTS

| | | | | |
|---|---|---|---|---|
| 6,556,265 | B1* | 4/2003 | Murade | G02F 1/136209 349/110 |
| 6,567,136 | B1* | 5/2003 | Sakuramoto | G02F 1/136209 349/110 |
| 11,903,289 | B2* | 2/2024 | Chen | H10K 59/353 |
| 2004/0140515 | A1* | 7/2004 | Yasukawa | H01L 31/02164 257/435 |
| 2004/0257489 | A1* | 12/2004 | Gotoh | G02F 1/136209 257/E27.113 |

(Continued)

FOREIGN PATENT DOCUMENTS

| | | |
|---|---|---|
| CN | 104867936 B | 2/2018 |
| CN | 112289841 A | 1/2021 |

*Primary Examiner* — Jarrett J Stark
(74) *Attorney, Agent, or Firm* — Anova Law Group, PLLC

(57) ABSTRACT

A display panel and a display device are provided. The display panel includes a base substrate, and one or more first transistors and one or more second transistors over the base substrate. A first transistor of the one or more first transistors includes a first active layer, and the first active layer contains silicon. A second transistor of the one or more second transistors includes a second active layer, and the second active layer contains an oxide semiconductor material. The display panel also includes a shielding layer. The shielding layer is disposed on a side of the first active layer facing away from the base substrate, and is disposed on a side of the second active layer facing away from the base substrate. Along a projection direction perpendicular to the base substrate, the shielding layer fully covers the second active layer.

16 Claims, 12 Drawing Sheets

(56) References Cited

U.S. PATENT DOCUMENTS

| | | | |
|---|---|---|---|
| 2008/0048190 A1* | 2/2008 | Ishii | H01L 29/42384 |
| | | | 257/E27.111 |
| 2009/0033842 A1* | 2/2009 | Yu | G02F 1/136209 |
| | | | 349/187 |
| 2009/0091254 A1* | 4/2009 | Jeong | H10K 59/126 |
| | | | 313/504 |
| 2011/0024754 A1* | 2/2011 | Yamazaki | G02F 1/136204 |
| | | | 257/E33.053 |
| 2015/0034921 A1* | 2/2015 | Kim | H10K 59/1213 |
| | | | 438/34 |
| 2016/0064421 A1* | 3/2016 | Oh | H01L 27/1255 |
| | | | 257/43 |
| 2016/0259190 A1* | 9/2016 | Yan | H01L 29/78633 |
| 2018/0374955 A1* | 12/2018 | Yoshida | G02F 1/134363 |
| 2019/0033672 A1* | 1/2019 | Ohori | H01L 27/1248 |
| 2019/0123119 A1* | 4/2019 | Miyamoto | H01L 29/78609 |
| 2022/0044636 A1* | 2/2022 | Mou | G09G 3/3258 |
| 2022/0140043 A1* | 5/2022 | Cao | H01L 27/1255 |
| | | | 257/43 |
| 2022/0254814 A1* | 8/2022 | Nishimura | H01L 29/78633 |
| 2022/0254851 A1* | 8/2022 | He | H01L 27/1251 |
| 2024/0032336 A1* | 1/2024 | Ke | H10K 59/1201 |

\* cited by examiner

DISPLAY PANEL AND DISPLAY DEVICE

CROSS-REFERENCE TO RELATED APPLICATION

This application claims the priority of Chinese patent application No. 202110164011.3, filed on Feb. 5, 2021, the entirety of which is incorporated herein by reference.

FIELD

The present disclosure generally relates to the field of display technology and, more particularly, relates to a display panel and a display device.

BACKGROUND

The display device provides various information in a form of an image on the screen, which is the core technology of information communication. Such display devices are becoming thinner, lighter, easier to carry, and have higher performance. Therefore, organic light-emitting display (OLED) devices are attracting attention. A display such as an organic light-emitting diode display contains a display pixel array based on light-emitting diodes. In such display, each display pixel includes a light-emitting diode and a thin film transistor to control applying a signal to the light-emitting diode. The display often contains a thin-film display driving circuit. For example, the gate driving circuit and the pixel driving circuit on the display may be composed of thin film transistors.

In a typical OLED device, a pixel driving circuit and an organic light-emitting element are formed on a substrate, and light emitted from the organic light-emitting element can pass through the substrate or a blocking layer, thereby displaying an image. However, the organic light-emitting element may be easily degraded due to internal factors, such as degradation of the electrode and emission layer due to oxygen or moisture, and degradation due to the reaction between the emission layer and the interface, etc. The organic light-emitting element may be easily degraded due to external factors such as moisture, oxygen, ultraviolet rays, and processing limitations of the device, etc. Among these factors, oxygen and moisture seriously affect the service life of the OLED device, and, thus, the packaging of the OLED device is very important. However, the existing packaging of the OLED device often affects the performance of the thin film transistor in the display panel, thereby affecting the display effect.

With the development of display technology, driven by market competition, display devices with better display effect are more and more sought after. Therefore, how to provide a display panel and display device that is capable of preventing the packaging of the OLED device from affecting the performance of the thin film transistors in the display panel and improving the display quality, is an urgent technical problem that needs to be solved.

SUMMARY

One aspect of the present disclosure provides a display panel. The display panel includes a base substrate, and one or more first transistors and one or more second transistors over the base substrate. A first transistor of the one or more first transistors includes a first active layer, and the first active layer contains silicon. A second transistor of the one or more second transistors includes a second active layer, and the second active layer contains an oxide semiconductor material. The display panel also includes a shielding layer. The shielding layer is disposed on a side of the first active layer facing away from the base substrate, and is disposed on a side of the second active layer facing away from the base substrate. Along a projection direction perpendicular to the base substrate, the shielding layer fully covers the second active layer.

Another aspect of the present disclosure provides a display device. The display device includes a display panel. The display panel includes a base substrate, and one or more first transistors and one or more second transistors over the base substrate. A first transistor of the one or more first transistors includes a first active layer, and the first active layer contains silicon. A second transistor of the one or more second transistors includes a second active layer, and the second active layer contains an oxide semiconductor material. The display panel also includes a shielding layer. The shielding layer is disposed on a side of the first active layer facing away from the base substrate, and is disposed on a side of the second active layer facing away from the base substrate. Along a projection direction perpendicular to the base substrate, the shielding layer fully covers the second active layer.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
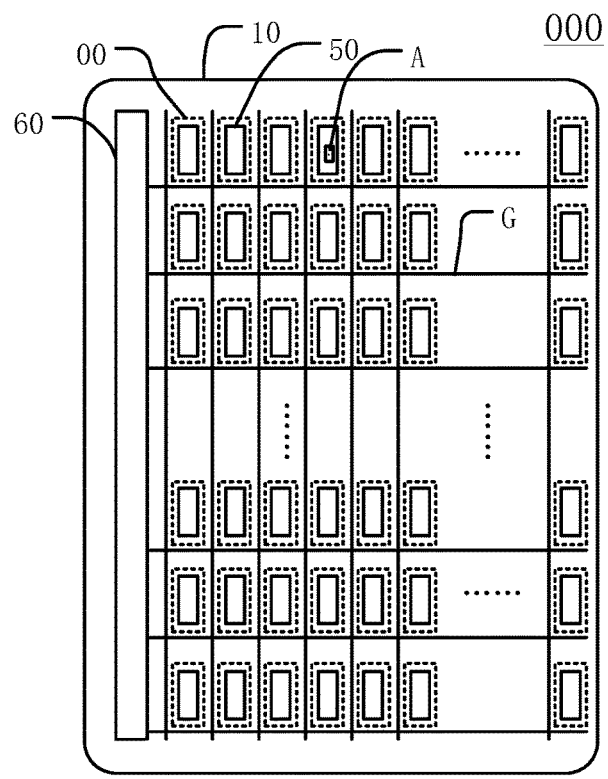
FIG. 1 illustrates a schematic top view of an exemplary display panel consistent with disclosed embodiments of the present disclosure.
Figure 2:
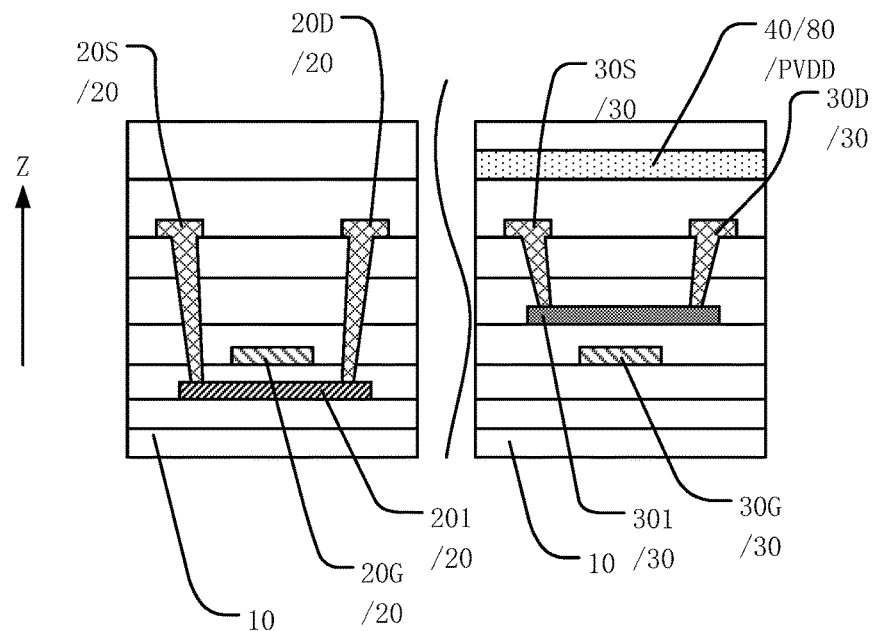
FIG. 2 illustrates a local cross-sectional view of film layers of a region A of an exemplary display panel in FIG. 1 consistent with disclosed embodiments of the present disclosure.

The present disclosure provides a display panel. FIG. 1 illustrates a schematic top view of a display panel consistent with disclosed embodiments of the present disclosure, and FIG. 2 illustrates a cross-sectional view of film layers of a region A of the display panel in FIG. 1. Referring to FIG. 1 and FIG. 2, a display panel 000 may include a base substrate 10, a first transistor 20 and a second transistor 30. The first transistor 20 and the second transistor 30 may be formed on the base substrate 10. The first transistor 20 may include a first active layer 201, and the first active layer 201 may contain silicon. The second transistor 30 may include a second active layer 301, and the second active layer 301 may contain oxide semiconductor material. Optionally, the first active layer 201 and the second active layer 301 may be disposed in different layers.

The display panel 000 may also include a shielding layer 40. The shielding layer 40 may be disposed on a side of the first active layer 201 facing away from the base substrate 10, and may be disposed on a side of the second active layer 301 facing away from the base substrate 10. Along a projection direction Z perpendicular to the base substrate 10, the shielding layer 40 may fully cover the second active layer 301.

The disclosed embodiments may explain that the display panel 000 may include the base substrate 10. The base substrate 10 may be used as a carrier substrate for each film layer structure of the display panel 000. At least the first transistor 20 and the second transistor 30 may be formed on the base substrate 10. The first transistor 20 may include the first active layer 201, and the first active layer 201 may contain silicon. In other words, the first transistor 20 may be a silicon transistor. Silicon may be polysilicon deposited by a low temperature method, i.e., low temperature poly-silicon (LTPS). The second transistor 30 may include a second active layer 301, and the second active layer 301 may contain oxide semiconductor material. In other words, the second transistor 30 may be an oxide semiconductor transistor, and the oxide semiconductor material may be amorphous indium gallium zinc oxide (IGZO).

Referring to FIG. 1, the display panel 000 may include a plurality of sub-pixels 00, and each sub-pixel 00 may include a pixel circuit 50 (shown as a block diagram in FIG. 1). The display panel 000 may also include a driving circuit 60 (such as a gate driving circuit, shown as a block diagram in FIG. 1) for providing a driving signal for the pixel circuit 50. The first transistor 20 and the second transistor 30 may be transistors in the driving circuit 60. In other words, the driving circuit 60 may include the first transistor 20 and/or the second transistor 30. In another embodiment, the first transistor 20 and the second transistor 30 may be transistors in the pixel circuit 50. In other words, the pixel circuit 50 may include the first transistor 20 and/or the second transistor 30.

Figure 3:
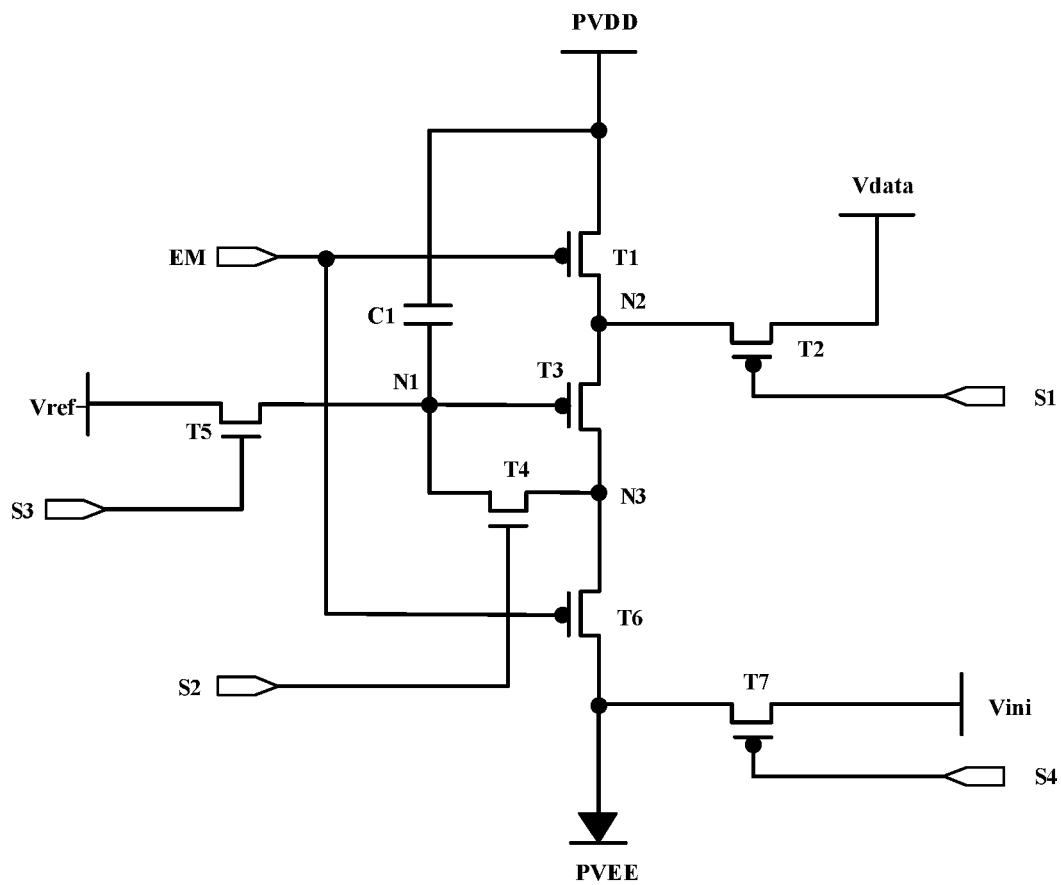
FIG. 3 illustrates a schematic diagram of a connection structure of a pixel circuit consistent with disclosed embodiments of the present disclosure.

FIG. 3 illustrates a schematic diagram of a connection structure of a pixel circuit consistent with disclosed embodiments of the present disclosure. Referring to FIG. 3, the pixel circuit with 7T1C (including 7 transistors and 1 capacitor) may at least include different types of the first transistor 20 and the second transistor 30. The first transistor 20 as the silicon transistor may have high mobility and desired stability, and may be used as the transistor T3, the transistor T1, the transistor T2, the transistor T6, and the transistor T7 in the pixel circuit. The second transistor 30 as the oxide semiconductor transistor may have a small leakage current in an off state, and may be used as the transistor T4 and the transistor T5 connected with the capacitor C1 in the pixel circuit, to maintain the voltage of the capacitor C1 stable and to achieve a low-frequency display.

For illustrative purposes, FIG. 2 merely illustrates that the pixel circuit 50 may include the first transistor 20 and the second transistor 30 as an example, while which may not be limited by the present disclosure. Any other circuit of the display panel 000, such as the driving circuit for providing a driving signal for the pixel circuit, may also include the above-mentioned first transistor 20 and the second transistor 30, which may not be repeated herein.

In the display panel 000, the first transistor 20 may be a silicon transistor, and the second transistor 30 may be an oxide semiconductor transistor. With respect to the second transistor 30 as the oxide semiconductor transistor, the first transistor 20 as the silicon transistor may have a substantially high carrier mobility. The first active layer 201 of the first transistor 20 may contain silicon, and the second active layer 301 of the second transistor 30 may contain oxide semiconductor. With respect to the oxide semiconductor transistor, the silicon transistor may be less sensitive to hydrogen (H) element, water, oxygen, etc. in the external environment. In other words, the second active layer 301 of the second transistor 30 may contain oxide semiconductor including a metal material, which may be substantially sensitive to the H element. In the manufacturing process of the display panel 000, after the second transistor 30 is formed, a plurality of insulating layers and an encapsulation layer may be further formed over the second transistor. The insulating layer and the encapsulation layer may contain a material such as silicon nitride and an organic material. Both the material such as silicon nitride and the organic material may contain a substantially large amount of H elements. As time changes, H elements may easily diffuse into the second transistor 30, such that the second transistor 30 may be corroded and fail, thereby affecting the display quality.

In the disclosed embodiments, the shielding layer 40 may be further formed over the base substrate 10 of the display panel 000. The shielding layer 40 may be disposed on a side of the first active layer 201 facing away from the base substrate 10, and the shielding layer 40 may also be disposed on a side of the second active layer 301 facing away from the base substrate 10. Along the projection direction Z perpendicular to the base substrate 10, the shielding layer 40 may fully cover the second active layer 301. In other words, in one embodiment, the second active layer 301 of the second transistor 30 as the oxide semiconductor transistor may be fully covered by the shielding layer 40. Therefore, the H elements in the organic layer and the encapsulation layer over the shielding layer 40 may be prevented from diffusing into the second transistor 30, which may avoid damaging the second transistor 30, and may facilitate to improve the overall display effect of the display panel 000.

It should be noted that in one embodiment, for illustrative purposes, each of the first transistor 20 and the second transistor 30 may be a transistor with a top-gate structure as an example. In specific implementation, each of the first transistor 20 and the second transistor 30 may be a transistor with bottom-gate structure. The circuit structures of the pixel circuit and the driving circuit that provides a driving signal for the pixel circuit included in the display panel 000 may not be limited by the present disclosure, as long as the driving circuit includes the first transistor 20 and/or the second transistor 30, and the pixel circuit includes the first transistor 20 and/or the second transistor 30. Therefore, at least two different types of transistors may be formed on the base substrate 10 of the display panel 000. In specific implementation, the structures of the pixel circuit and the driving circuit of the display panel 000 designed to achieve display function may be understood according to related technology.

It should be understood that FIG. 1 and FIG. 2 may exemplarily depict the planar structure and local cross-sectional structure of the film layers of the display panel 000. The display panel 000 may further include any other film layer that is capable of achieving the related function of the display panel. The display panel 000 may be an organic light-emitting display panel, and may further include a scanning signal line, a data signal line, various insulating layers, a light-emitting layer, an electrode layer, and a power signal line, etc., which may not be repeated herein. In specific implementation, the structure of the display panel 000 may be understood according to related technology.

Figure 4:
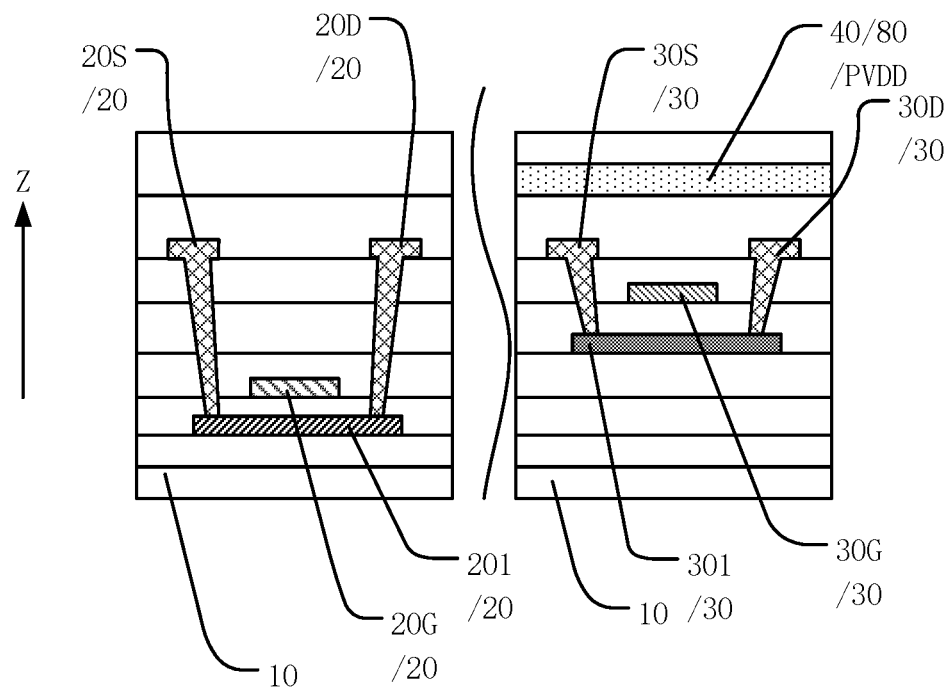
FIG. 4 illustrates a local cross-sectional view of film layers of a region A of another exemplary display panel in FIG. 1 consistent with disclosed embodiments of the present disclosure.

FIG. 4 illustrates another local cross-sectional view of film layers of a region A of the display panel in FIG. 1. In certain embodiments, referring to FIG. 1, FIG. 2 and FIG. 4, the display panel 000 may include the driving circuit 60, the pixel circuit 50 and a light-emitting element 70. Optionally, the light-emitting element 70 may be a light-emitting diode. The pixel circuit 50 may be electrically connected to the light-emitting element 70. The driving circuit 60 may be configured to provide a driving signal for the pixel circuit 50, and the pixel circuit 50 may be configured to provide a driving current for the light-emitting element 70.

The first transistor 20 and the second transistor 30 may be located in the driving circuit 60 or the pixel circuit 50.

The first transistor 20 may include a first gate 20G, a first source 20S, and a first drain 20D. The second transistor 30 may include a second gate 30G, a second source 30S, and a second drain 30D. The shielding layer 40 may be disposed on a side of each of the second source 30S and the second drain 30D facing away from the base substrate 10. Optionally, the first active layer 201 may contain silicon, and the second active layer 301 may contain oxide semiconductor material. In other words, the first active layer 201 and the second active layer 301 may be different film layers. For illustrative purposes, the second active layer 301 may be disposed on a side of the first active layer 201 facing away from the base substrate 10 as an example. The first gate 20G and the second gate 30G may be in a same film layer in the display panel. In view of this, the first transistor 20 may be a transistor with a top-gate structure, and the second transistor 30 may be a transistor with a bottom-gate structure (as shown in FIG. 2). The first source 20S, the first drain 20D of the first transistor 20 may be disposed in a same film layer as the second source 30S and the second drain 30D of the second transistor 30.

In another embodiment, the first gate 20G and the second gate 30G may be disposed in different film layers in the display panel. The film layer where the second gate 30G is located may be located on a side of the film layer where the first gate 20G is located facing away from the base substrate 10. In view of this, each of the first transistor 20 and the second transistor 30 may be a transistor with a top-gate structure (as shown in FIG. 4). The first source 20S and the first drain 20D of the first transistor 20 may be disposed in a same film layer as the second source 30S and the second drain 30D of the second transistor 30.

The disclosed embodiments may explain that the display panel 000 may include the pixel circuit 50 and the driving circuit 60 that provides a driving signal for the pixel circuit 50. For example, the driving circuit 60 may be a gate driving circuit, and the gate driving circuit 60 may be electrically connected with scanning signal lines G (not illustrated in the Figure). The scanning signal lines G may be electrically connected to the first gate 20G of the first transistor 20 and the second gate 30G of the second transistor 30, and may be configured to provide a scanning driving signal for the pixel circuit 50 of each sub-pixel 00. The pixel circuit 50 may be electrically connected to the light-emitting element 70, and the pixel circuit 50 may provide a driving current for the light-emitting element 70 to control the light-emitting element 70 to emit light.

The first transistor 20 as the silicon transistor and the second transistor 30 as the oxide semiconductor transistor may be contained in the driving circuit 60 or the pixel circuit 50. The second transistor 30 may include a second gate 30G, a second source 30S, and a second drain 30D. The shielding layer 40 may be disposed on the side of the film layer including the second source 30S and the second drain 30D facing away from the base substrate 10, and may be configured to fully cover the second active layer 301 along the projection direction Z perpendicular to the base substrate 10. Therefore, the shielding layer 40 may prevent the H elements in the organic layer and the encapsulation layer over the shielding layer 40 from diffusing into the second transistor 30, thereby avoiding damaging the second transistor 30, which may facilitate to improve the overall display effect of the display panel 000.

In certain embodiments, referring to FIGS. 1-4, in one embodiment, the display panel 000 may further include a first power signal line 80 for providing the pixel circuit 50 with a first power signal PVDD. The first power signal PVDD may be applied to the shielding layer 40.

This disclosed embodiments may explain that the pixel circuit 50 may often be connected with the first power signal line 80, and the first power signal line 80 may be connected to the first power signal PVDD to provide the pixel circuit 50 with the first power signal PVDD. For example, referring to FIG. 3, the capacitor C1 and the transistor T1 in the pixel circuit with 7T1C may be connected to the first power supply signal PVDD. The first power signal PVDD may be applied to the shielding layer 40. In other words, the shielding layer 40 may be multiplexed as the first power signal line 80. Therefore, the shielding layer 40 may be used to block the H elements in the organic layer and the encapsulation layer over the shielding layer from diffusing into the second transistor 30, which may provide effective protection for the second transistor 30 as the oxide semiconductor transistor, may avoid damaging the second transistor 30, and may facilitate to improve the overall display effect of the display panel 000. Further, the shielding layer 40 may be used to provide the first power signal PVDD. Because the shielding layer 40 is located on the side of the second active layer 301 of the second transistor 30 facing away from the base substrate 10, optionally, the shielding layer 40 may be disposed on the side of the film layer including the second source 30S and the second drain 30D of the second transistor 30 facing away from the base substrate 10. Therefore, a quantity of wirings disposed in a same layer as the shielding layer 40 may be substantially small, and, thus, the first power signal line 80 may be set substantially wide, which may facilitate to reduce the resistance of the first power signal line 80, and may improve the transmission capability of the first power signal PVDD.

It should be understood that the width of the first power signal line 80 may not be limited by the present disclosure, as long as the first power signal line 80 does not affect any other trace of the shielding layer 40, avoids short-circuit, and is capable of fully covering the second active layer 301 of the second transistor 30.

Figure 5:
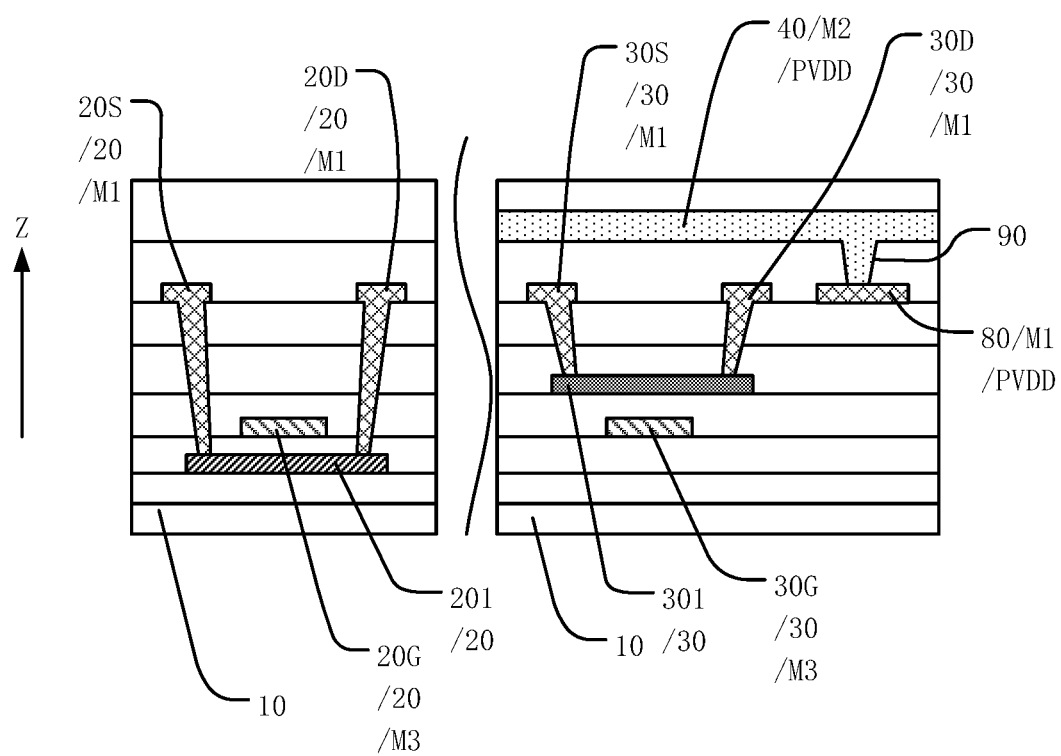
FIG. 5 illustrates a local cross-sectional view of film layers of a region A of another exemplary display panel in FIG. 1 consistent with disclosed embodiments of the present disclosure.
Figure 6:
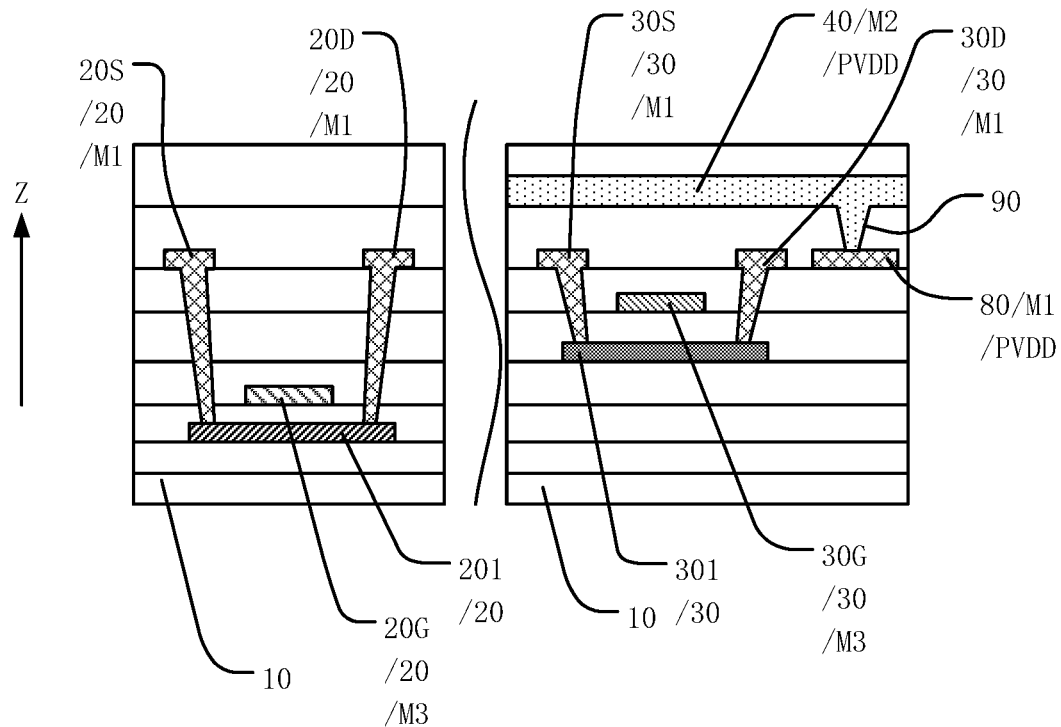
FIG. 6 illustrates a local cross-sectional view of film layers of a region A of another exemplary display panel in FIG. 1 consistent with disclosed embodiments of the present disclosure.

FIG. 5 illustrates a local cross-sectional view of film layers of a region A of the display panel in FIG. 1; and FIG. 6 illustrates another local cross-sectional view of film layers of a region A of the display panel in FIG. 1. In certain embodiments, referring to FIG. 1, FIG. 3, FIG. 5 and FIG. 6, the display panel 000 may further include the first power signal line 80 for providing the first power signal PVDD for the pixel circuit 50. The first power signal line 80 may be disposed in a first metal layer M1, and the shielding layer 40 may be disposed in a second metal layer M2. The second metal layer M2 may be disposed on the side of the first metal layer M1 facing away from the base substrate 10. The first power signal line 80 may be connected to the shielding layer 40 through a via 90.

The disclosed embodiments may explain that the pixel circuit 50 may often be connected to the first power signal line 80. The first power signal line 80 may be connected to the first power signal PVDD to provide the pixel circuit 50 with the first power signal PVDD. For example, referring to FIG. 3, the capacitor C1 and the transistor T1 in the pixel circuit with 7T1C may be connected to the first power supply signal PVDD. The first power signal PVDD may be applied to the shielding layer 40. In other words, the structure for providing the first power signal PVDD for the pixel circuit 50 may be a structure in which two layers are arranged in parallel. The first power signal line 80 may be disposed in the first metal layer M1, and the shielding layer 40 may be disposed in the second metal layer M2. The first power signal line 80 may be electrically connected in parallel with the shielding layer 40 through the via 90 (the local cross-sectional view of film layers shown in FIG. 5 and FIG. 6 may be a cross-sectional view of the via 90). The second metal layer M2 may be disposed on the side of the first metal layer M1 facing away from the base substrate 10.

Optionally, the first metal layer M1 may be the film layer including the first source 20S and the first drain 20D of the first transistor 20 as well as the second source 30S and the second drain 30D of the second transistor 30. In one embodiment, the shielding layer 40 disposed in the second metal layer M2 may be multiplexed as the first power signal line 80.

Therefore, the shielding layer 40 may be used to block the H elements in the organic layer and the encapsulation layer over the shielding layer from diffusing into the second transistor 30, which may provide effective protection for the second transistor 30 as the oxide semiconductor transistor, may avoid damaging the second transistor 30, and may facilitate to improve the overall display effect of the display panel 000. Further, the shielding layer 40 disposed in the second metal layer M2 may be electrically connected with the first power signal line 80 disposed the first metal layer M1 through the via 90, to achieve the parallel connection of the first power signal line 80 and the shielding layer 40, thereby reducing a resistance of the first power signal line 80 and improving the transmission capability of the first power signal PVDD.

It should be understood that the display panel 000 may also include any other metal film layer, e.g. a metal film layer for forming the first gate 20G of the first transistor 20 and the second gate 30G of the second transistor 30 on the side of the first metal layer M1 facing away from the second metal layer M2, which may not be repeated herein.

Figure 7:
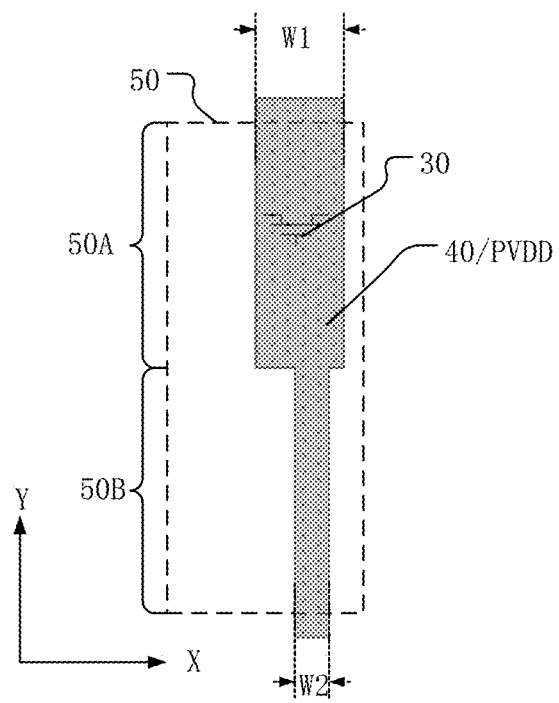
FIG. 7 illustrates a schematic top view of a pixel circuit consistent with disclosed embodiments of the present disclosure.

FIG. 7 illustrates a schematic top view of a pixel circuit consistent with disclosed embodiments of the present disclosure. In certain embodiments, referring to FIGS. 1-7, one pixel circuit 50 may include at least one second transistor 30.

The first power signal line 80 may be extended along a first direction Y. The pixel circuit 50 may include a first region 50A and a second region 50B. The first region 50A and the second region 50B may be arranged along the first direction Y. The first region 50A may include a second transistor 30, and the second region 50B may not include the second transistor 30.

Along a second direction X, a width W1 of the shielding layer 40 over the first region 50A may be greater than a width W2 of the shielding layer 40 over the second region 50B. The second direction X may be perpendicular to the first direction Y.

The disclosed embodiments may explain that one pixel circuit 50 may include at least one second transistor 30. The first power signal line 80 that provides the first power signal PVDD for the pixel circuit 50 may be extended along the first direction Y, and the pixel circuit 50 may include the first region 50A and the second region 50B that are arranged along the first direction Y. The second transistor 30 may be disposed in the first region 50A, and the second region 50B may not include the second transistor 30. In one embodiment, along the second direction X, the width W1 of the shielding layer 40 over the first region 50A may be greater than the width W2 of the shielding layer 40 over the second region 50B. The second direction X may be perpendicular to the first direction Y.

Therefore, the shielding layer 40 may be multiplexed as the first power signal line 80, or the shielding layer 40 and the first power signal line 80 may be electrically connected in parallel through the via 90. The width W1 of the shielding layer 40 over the first region 50A that contains the second transistor 30 as the oxide semiconductor transistor may be greater than the width W2 of the shielding layer 40 over the second region 50B that does not contain the second transistor 30 as the oxide semiconductor transistor. While ensuring the protection effect of the shielding layer 40 over the second transistor 30 and ensuring the resistance of the first power signal line 80 in the pixel circuit 50, the width of the first power signal line 80 may be appropriately narrowed in the second region 50B that does not contain the second transistor 30 as the oxide semiconductor transistor, which may facilitate avoidance of the wirings in the second region 50B and may prevent a substantially large parasitic capacitance generated in the pixel circuit 50 from affecting the driving effect of the pixel circuit 50.

It should be noted that FIG. 7 merely illustrates a schematic top view of the pixel circuit 50. In specific implementation, the wiring and connection structure of the transistors and capacitors in the pixel circuit 50 may not be limited by the present disclosure, and may have any other layout structure. As long as in the pixel circuit 50, the width W1 of the shielding layer 40 over the first region 50A that contains the second transistor 30 as the oxide semiconductor transistor is greater than the width W2 of the shielding layer 40 over the second region 50B that does not contain the second transistor 30 as the oxide semiconductor transistor, the wiring structure may not be limited by the present disclosure.

Figure 8:
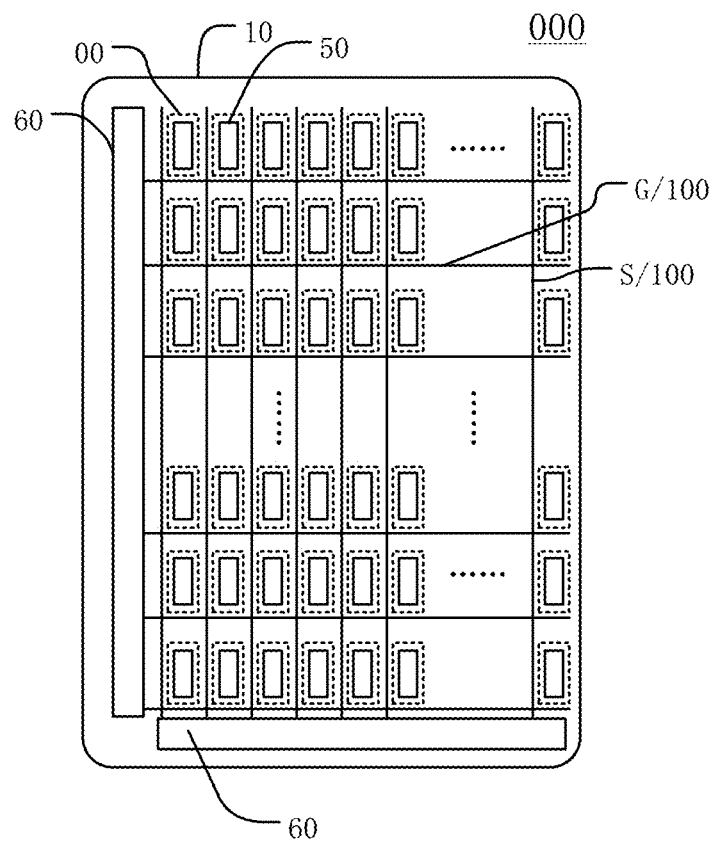
FIG. 8 illustrates a schematic top view of another exemplary display panel consistent with disclosed embodiments of the present disclosure.
Figure 9:
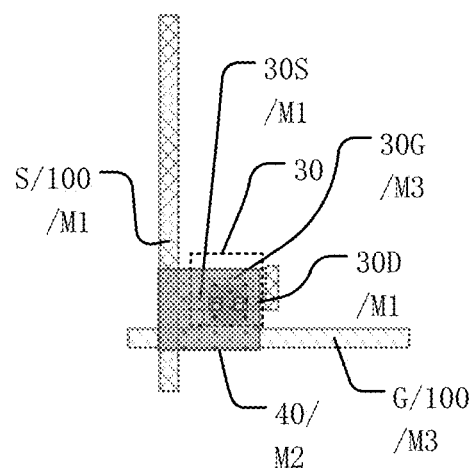
FIG. 9 illustrates a schematic local zoom-in top-view of a sub-pixel of the display panel in FIG. 8 consistent with disclosed embodiments of the present disclosure.

FIG. 8 illustrates a schematic top view of another display panel consistent with disclosed embodiments of the present disclosure; and FIG. 9 illustrates a schematic local zoom-in top-view of a sub-pixel of the display panel in FIG. 8. In certain embodiments, referring to FIGS. 1-6 and FIGS. 8-9, the display panel 000 may further include a first driving signal line 100. For illustrative purposes, to clearly illustrate the overlap relationship between the shielding layer 40 and the first driving signal line 100, FIG. 9 illustrates transparency filling. The first driving signal line 100 may be disposed in the first metal layer M1 or a third metal layer M3, and the third metal layer M3 may be disposed on a side of the first metal layer M1 adjacent to the base substrate 10.

The pixel circuit 50 may include at least one second transistor 30, and the first driving signal line 100 may be connected to at least one of the second source 30S, the second drain 30D, and the second gate 30G of the second transistor 30, to provide a first driving signal for the second transistor 30, or to control the turn-on and turn-off of the second transistor 30 through the first driving signal. The shielding layer 40 may overlap at least a portion of the first driving signal line 100.

The disclosed embodiments may explain that the display panel 000 may include a plurality of sub-pixels 00, and each sub-pixel 00 may include a pixel circuit 50. The display panel 000 may also include a driving circuit 60 (such as a gate driving circuit, a source driving circuit, etc.) to provide a driving signal for the pixel circuit. The display panel 000 may also include a plurality of first driving signal lines 100. Optionally, the first driving signal line 100 may be a scanning signal line G, or a data signal line S.

When the first driving signal line 100 is the scanning signal line G, the first driving signal line 100 may be disposed in the third metal layer M3, and the third metal layer M3 may be disposed on the side of the first metal layer M1 adjacent to the base substrate 10. The second gate 30G of the second transistor 30 may be disposed in the third metal layer M3, and the first driving signal line 100 may be connected with the second gate 30G of the second transistor 30 (or the first gate 20G of the first transistor 20), and the first driving signal line 100 may be electrically connected with the driving circuit 60 (gate driving circuit). The driving circuit 60 may provide a scanning driving signal to the first driving signal line 100. The first driving signal applied on the first driving signal line 100 may control the turn-on and turn-off of the second transistor 30 (or the first transistor 20).

When the first driving signal line 100 is the data signal line S, the first driving signal line 100 may be disposed in the first metal layer M1 (i.e., the same film layer as the second source 30S and the second drain 30D of the second transistor 30). The first driving signal line 100 may be connected with the second source 30S or the second drain 30D of the second transistor 30 (or the first source 20S or the first drain 20D of the first transistor 20). The first driving signal line 100 may be electrically connected to a driving circuit 60 (a source driving circuit or a driving chip, etc.), and the driving circuit 60 may provide a first driving signal for the first driving signal line 100.

In the present disclosure, the display panel 000 may include the first driving signal line 100. The first driving signal line 100 may be at least connected to the second transistor 30. To fully ensure that the shielding layer 40 effectively protects the second transistor 30, the shielding layer 40 may overlap at least a portion of the first driving signal line 100, to ensure the protection effect of the shielding layer 40 on the second transistor 30.

It should be understood that for illustrative purposes, the embodiment associated with FIG. 8 merely illustrates that the first driving signal line 100 is the scanning signal line G or the data signal line S as an example. In specific implementation, the first driving signal line 100 may be any other driving signal line, such as a reference voltage signal line, etc., which may not be limited by the present disclosure, as long as when the first driving signal line 100 is connected to the second transistor 30, the shielding layer 40 may cover at least a portion of the first driving signal line 100.

Figure 10:
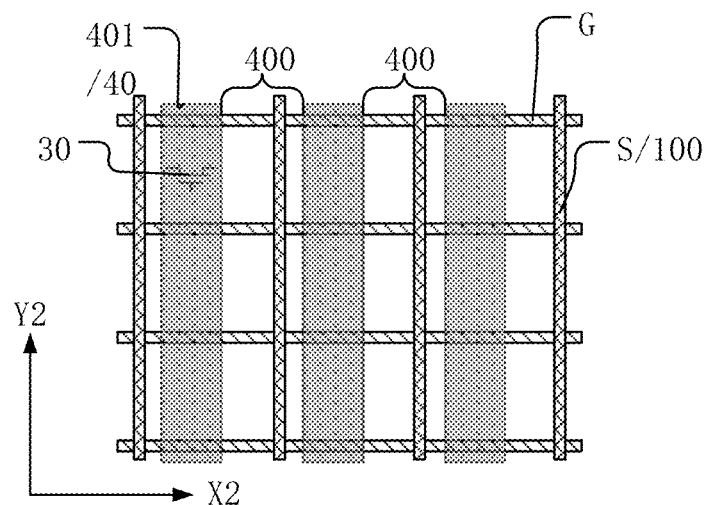
FIG. 10 illustrates a schematic local top-view of an exemplary display panel consistent with disclosed embodiments of the present disclosure.
Figure 11:
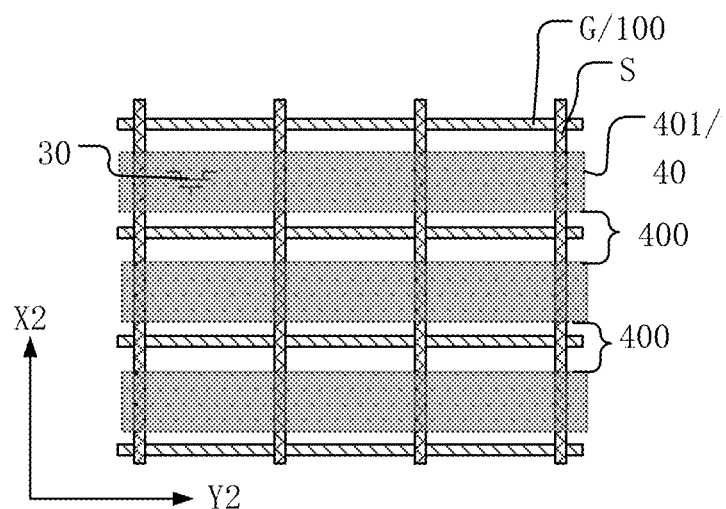
FIG. 11 illustrates a schematic local top-view of another exemplary display panel consistent with disclosed embodiments of the present disclosure.

FIG. 10 illustrates a schematic local top-view of another display panel consistent with disclosed embodiments of the present disclosure; and FIG. 11 illustrates a schematic local top-view of another display panel consistent with disclosed embodiments of the present disclosure. For illustrative purposes, to clearly illustrate the structure of the shielding layer 40, FIG. 10 and FIG. 11 illustrate transparency filling. In certain embodiments, referring to FIGS. 1-11, one pixel circuit 50 may include at least one second transistor 30. The shielding layer 40 may include a plurality of shielding regions 401. One shielding region 401 may cover at least one second transistor 30 disposed in the pixel circuit 50. Adjacent shielding regions 401 may be arranged along a third direction X2, and an interval 400 between adjacent shielding regions 401 may be extended along a fourth direction Y2. The third direction X2 may be perpendicular to the fourth direction Y2

The first driving signal line 100 may be extended along the fourth direction Y2. Along the projection direction Z perpendicular to the base substrate 10, the first driving signal line 100 may overlap the interval 400 between the adjacent shielding regions 401.

The disclosed embodiments may explain that the shielding layer 40 may include a plurality of shielding regions 401, and one shielding region 401 may cover at least one second transistor 30 disposed in the pixel circuit 50. In other words, each oxide semiconductor transistor in the pixel circuit 50 may be covered by the shielding layer 40. The adjacent shielding regions 401 may be arranged along the third direction X2 (a horizontal direction in FIG. 10), and the interval 400 between the adjacent shielding regions 401 may be extended along the fourth direction Y2 (a longitudinal direction in FIG. 10). The third direction X2 may be perpendicular to the fourth direction Y2. The first driving signal line 100 may be a data signal line S extended along the fourth direction Y2. Along the projection direction Z perpendicular to the base substrate 10, the first driving signal line 100 may overlap the interval 400 between the adjacent shielding regions 401.

Optionally, referring to FIG. 11, adjacent shielding regions 401 may be arranged along the third direction X2 (the longitudinal direction in FIG. 11), and the interval 400 between the adjacent shielding regions 401 may be extended along the fourth direction Y2 (the horizontal direction in FIG. 11). The third direction X2 may be perpendicular to the fourth direction Y2. The first driving signal line 100 may be a scanning signal line G extended along the fourth direction Y2. Along the projection direction Z perpendicular to the base substrate 10, the first driving signal line 100 may overlap the interval 400 between the adjacent shielding regions 401.

Therefore, in an extension direction of the first driving signal line 100, the shielding layer 40 may not be provided as much as possible, to avoid the overlap between the shielding layer 40 and the first driving signal line 100 as much as possible, and to prevent unnecessary parasitic capacitance generated between the shielding layer 40 and the first driving signal line 100 from increasing the load and affecting the driving effect of the pixel circuit.

It should be noted that FIG. 10 and FIG. 11 merely illustrate exemplary shape and size of each shielding region 401 of the shielding layer 40. In specific implementation, the shape of the shielding region 401 may not be limited to this, and may be determined based on the shape and size of the second active layer 301 of the second transistor 30, as long as the shielding layer 40 is capable of fully covering the second active layer 301 of the second transistor 30, which may not be repeated herein.

Figure 12:
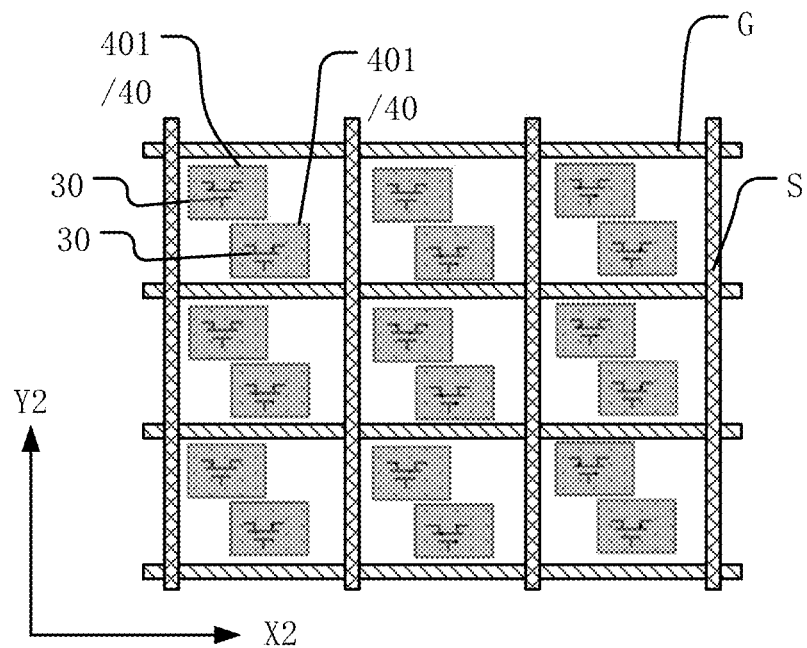
FIG. 12 illustrates a schematic local top-view of another exemplary display panel consistent with disclosed embodiments of the present disclosure.

FIG. 12 illustrates a schematic local top-view of another display panel consistent with disclosed embodiments of the present disclosure. For illustrative purposes, to clearly illustrate the structure of the shielding layer 40, FIG. 12 illustrates transparency filling. Optionally, referring to FIG. 12, one pixel circuit 50 may include a plurality of second transistors 30, and the shielding layer 40 may include a plurality of shielding regions 401. Each shielding region 401 may overlap one second transistor 30, such that the second active layer 301 of each second transistor 30 may be covered by a shielding region 401, to ensure the protection effect of the shielding layer 40 on the second transistor 30.

Figure 13:
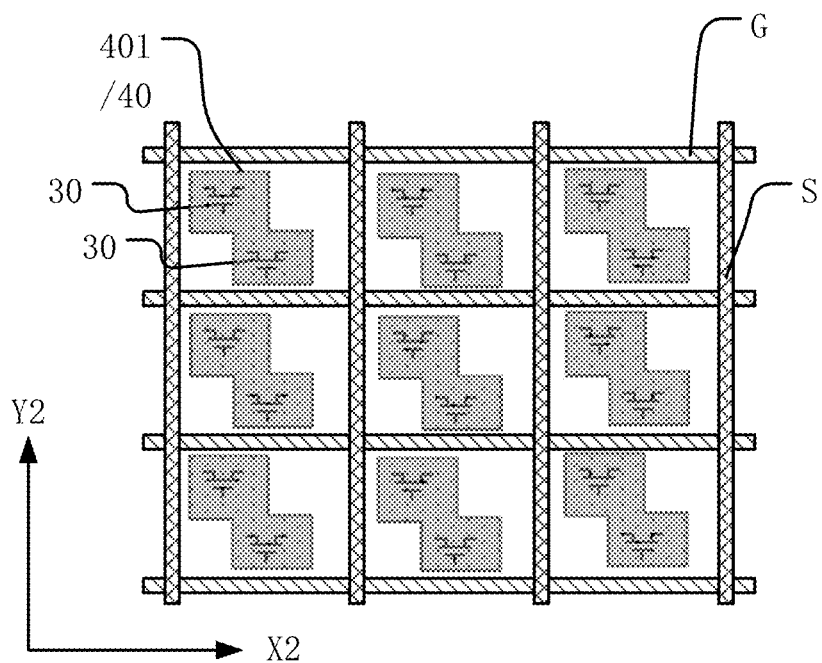
FIG. 13 illustrates a schematic local top-view of another exemplary display panel consistent with disclosed embodiments of the present disclosure.

FIG. 13 illustrates a schematic local top-view of another display panel consistent with disclosed embodiments of the present disclosure. For illustrative purposes, to clearly illustrate the structure of the shielding layer 40, FIG. 13 illustrates transparency filling. In certain embodiments, referring to FIGS. 1-9 and FIG. 13, one pixel circuit 50 may include a plurality of second transistors 30, and one shielding region 401 of the shielding layer 40 may at least correspond to all the second transistors 30 in one pixel circuit 50. In other words, the shape of one shielding region 401 of the shielding layer 40 may cover two second transistors 30 in one pixel circuit 50. Alternatively, the shape of one shielding region 401 of the shielding layer 40 may cover three second transistors 30 in one pixel circuit 50. Alternatively, the shape of one shielding region 401 of the shielding layer 40 may cover the plurality of second transistors 30 in one pixel circuit 50. For illustrative purposes, FIG. 13 illustrates that one pixel circuit 50 may include two second transistors 30 as an example. Therefore, various shielding regions 401 over the second transistors 30 in each pixel circuit 50 may be continuous and may not be disconnected, which may facilitate to simplify the manufacturing process of the shielding layer 40 and to improve the process efficiency.

It should be noted that FIG. 13 merely illustrates exemplary shape and size of each shielding region 401 of the shielding layer 40. In specific implementation, the shape of the shielding region 401 may not be limited to this, and may be determined based on the shapes and size of the second active layers 301 of the plurality of second transistors 30 in one pixel circuit 50, as long as the shielding layer 40 is capable of fully covering the second active layers 301 of all the second transistors 30 in one pixel circuit, which may not be repeated herein.

Figure 14:
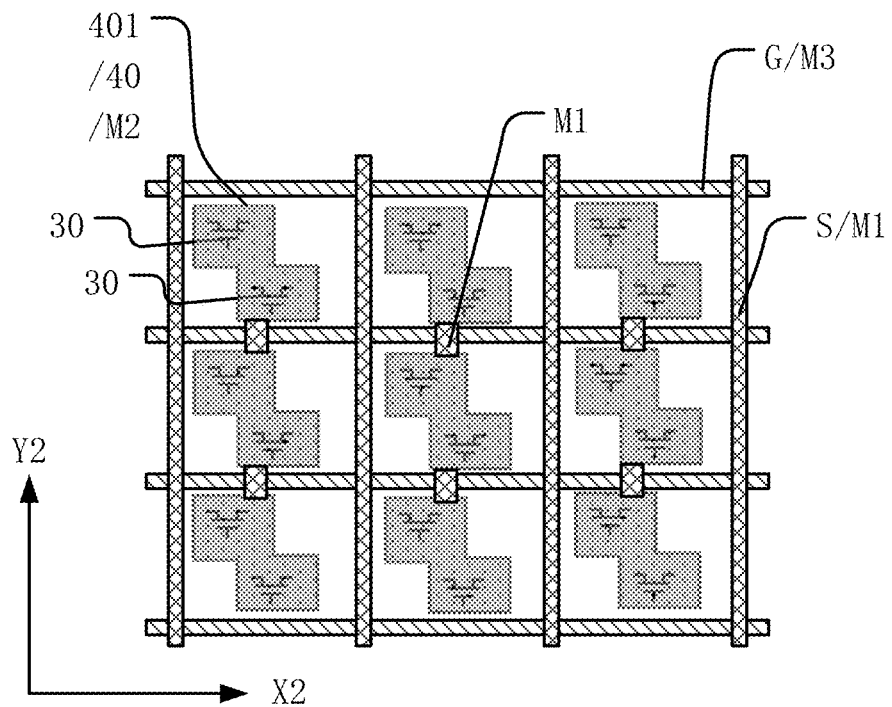
FIG. 14 illustrates a schematic local top-view of another exemplary display panel consistent with disclosed embodiments of the present disclosure.

FIG. 14 illustrates a schematic local top-view of another display panel consistent with disclosed embodiments of the present disclosure. For illustrative purposes, to clearly illustrate the structure of the shielding layer 40, FIG. 14 illustrates transparency filling. In certain embodiments, referring to FIGS. 1-9 and FIG. 14, adjacent shielding layers 40 may be electrically connected to each other through the first metal layer M1.

The disclosed embodiments may explain that when the second transistor 30 of each pixel circuit 50 is covered by the shielding layer 40, because the sub-pixels 00 corresponding to one pixel circuit 50 are often arranged in an array, the shielding layers 40 over the second transistors 30 in each pixel circuit 50 may be arranged in an array. The adjacent two shielding layers 40 arranged along the fourth direction Y2 may be electrically connected to each other by a connection structure disposed in the first metal layer M1.

Optionally, the connection structure disposed in the first metal layer M1 may not be disposed between adjacent two shielding layers 40 arranged along the third direction X2, to avoid overlap and short-circuit with the data signal line S. When the shielding layer 40 is connected to the first power signal PVDD, the connection structure disposed in the first metal layer M1 may be used as the first power signal line 80. Referring to FIG. 5 and FIG. 6, the via 90 may be disposed at the connection between different film layers, which may not be illustrated in FIG. 14. Therefore, when forming an integral structure by electrically connecting adjacent two shielding layers 40 in the fourth direction Y2 through the first metal layer M1, the first power signal line 80 (the connection structure disposed in the first metal layer M1) and the shielding layer 40 may be connected in parallel, thereby reducing the resistance on the first power signal line 80 and improving the transmission capability of the first power signal PVDD. Further, the number of wirings in the second metal layer M2 may be reduced, which may provide layout space for disposing a substantially wide shielding layer 40.

Figure 15:
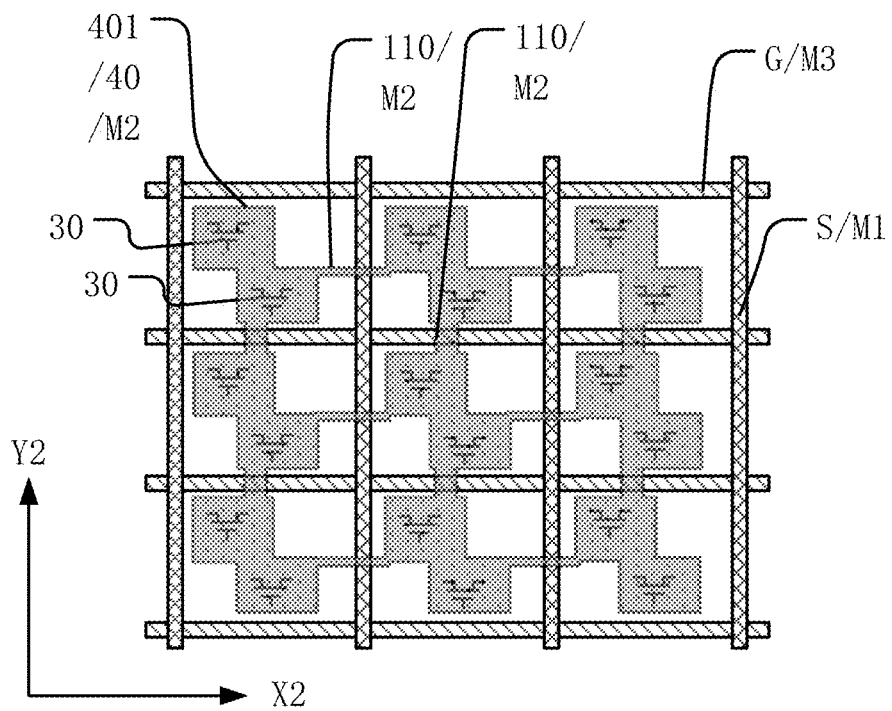
FIG. 15 illustrates a schematic local top-view of another exemplary display panel consistent with disclosed embodiments of the present disclosure.

FIG. 15 illustrates a schematic local top-view of another display panel consistent with disclosed embodiments of the present disclosure. For illustrative purposes, to clearly illustrate the structure of the shielding layer 40, FIG. 15 illustrates transparency filling. In certain embodiments, referring to FIGS. 1-9 and FIG. 15, adjacent shielding layers 40 may be electrically connected to each other through a first auxiliary line 110, and the shielding layer 40 and the first auxiliary line 110 may be disposed in the second metal layer M2.

The disclosed embodiments may explain that when the second transistor 30 of each pixel circuit 50 is covered by the shielding layer 40 t, because the sub-pixels 00 corresponding to one pixel circuit 50 are often arranged in an array, the shielding layers 40 over the second transistors 30 of each pixel circuit 50 may be arranged in an array. Any adjacent two shielding layers 40 may be electrically connected to each other through the first auxiliary line 110 disposed in the second metal layer M2. In the present disclosure, the first auxiliary line 110 electrically connecting the adjacent two shielding layers 40 and the shielding layer 40 may be disposed in a same layer, and may be disposed in the second metal layer M2. Therefore, when forming an integral structure by electrically connecting adjacent two shielding layers 40 through the first auxiliary line 110, the shielding layer 40 may be guaranteed to have sufficient area to fully cover all the second transistors 30, and to effectively protect the second transistor 30.

Figure 16:
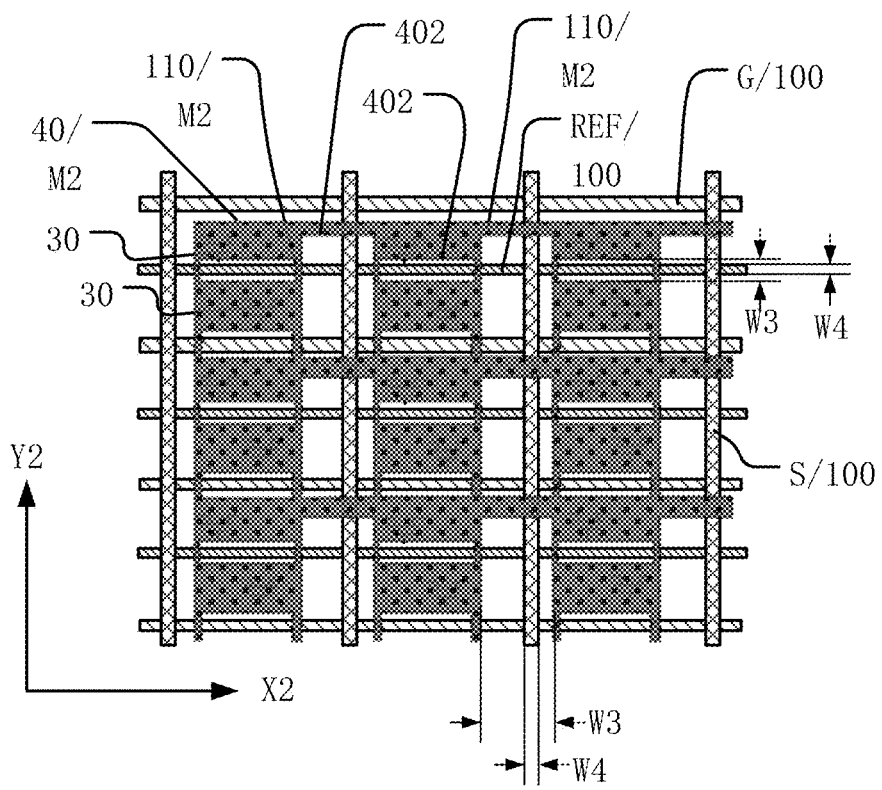
FIG. 16 illustrates a schematic local top-view of another exemplary display panel consistent with disclosed embodiments of the present disclosure.

FIG. 16 illustrates a schematic local top-view of another display panel consistent with disclosed embodiments of the present disclosure. For illustrative purposes, to clearly illustrate the structure of the shielding layer 40, FIG. 16 illustrates transparency filling. In certain embodiments, referring to FIGS. 1-9 and FIG. 16, the shielding layer 40 may include a plurality of hollowed regions 402. The hollowed region 402 may at least partially overlap the first driving signal line 100, and in the overlapped region, a width W3 of the hollowed region 402 may be greater than a width W4 of the first driving signal line 100.

The disclosed embodiments may explain that the display panel 000 may include a plurality of first driving signal lines 100. Optionally, a first driving signal line 100 may be any one of the data signal line S, the scanning signal line G, and a reference signal line REF. The data signal line S may provide a data signal for the pixel circuit 50, a scanning signal line G may provide a scanning driving signal for the pixel circuit 50, and the reference signal line REF may provide a reference signal for the pixel circuit 50. For illustrative purposes, FIG. 16 illustrates that the scanning signal line G and the reference signal line REF may be extended along a same direction, and both may be extended along the third direction X2 as an example. The shielding layer 40 may include a plurality of hollowed regions 402. The hollowed region 402 may at least partially overlap the first driving signal line 100, and in the overlapped region, the width W3 of the hollowed region 402 may be greater than the width W4 of the first driving signal line 100. Therefore, an area of the overlapped region between the shielding layer 40 and the first driving signal line 100 may be reduced, and the parasitic capacitance may be reduced, thereby reducing the influence of the shielding layer 40 on the driving signal of the first driving signal line 100, which may facilitate to improve the display quality.

Figure 17:
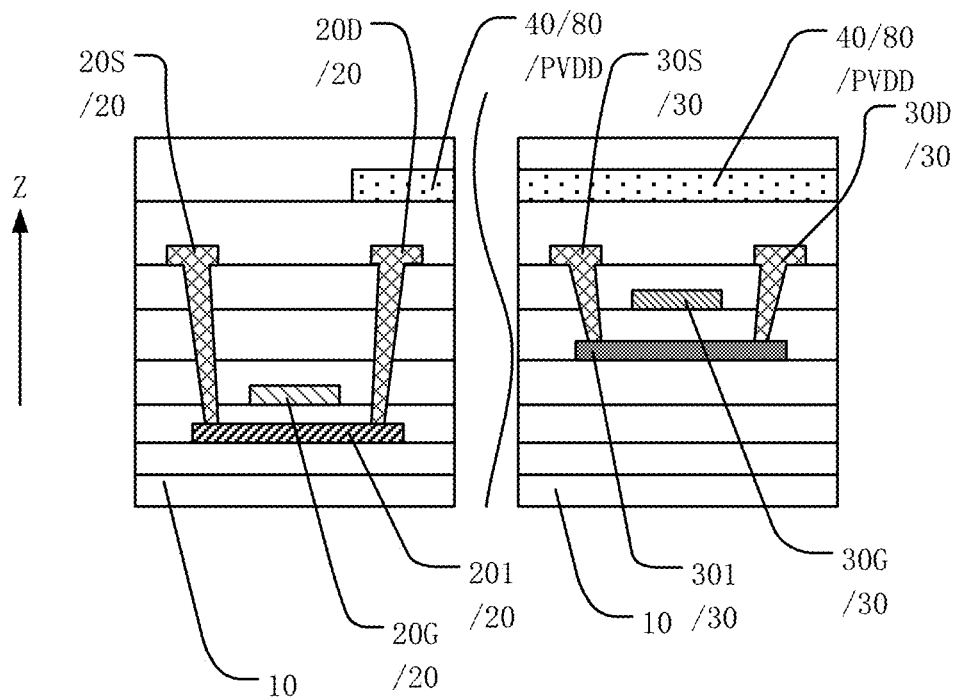
FIG. 17 illustrates a local cross-sectional view of film layers of a region A of another exemplary display panel in FIG. 1 consistent with disclosed embodiments of the present disclosure.

FIG. 17 illustrates another local cross-sectional view of film layers of a region A of the display panel in FIG. 1. In certain embodiments, referring to FIGS. 1-9 and FIG. 17, one pixel circuit 50 may include at least one first transistor 20 and at least one second transistor 30.

Along the projection direction Z perpendicular to the base substrate 10, the shielding layer 40 may fully cover the second active layer 301 of at least one second transistor 30 in the pixel circuit 50, and may not fully overlap the first active layer 201 of at least one first transistor 20 in the pixel circuit 50.

The disclosed embodiments may explain that one pixel circuit 50 of the display panel 000 may include at least one first transistor 20 and at least one second transistor 30. The pixel circuit with 7T1C illustrated in FIG. 3 may include five first transistors 20 and two second transistors 30. Along the projection direction Z perpendicular to the base substrate 10, the shielding layer 40 may fully cover the second active layer 301 of at least one second transistor 30 in the pixel circuit 50, and may not fully overlap the first active layer 201 of at least one first transistor 20 in the pixel circuit 50.

In other words, because the structure of the pixel circuit 50 is substantially complicated, the shielding layer 40 may need to have an area as large as possible while avoiding certain structures of the pixel circuit 50, to ensure the shielding effect while making the parasitic capacitance generated by the pixel circuit 50 be as small as possible. In view of this, the shielding layer 40 may not fully overlap the first active layer 201 of the at least one first transistor 20 as the silicon transistor, and may fully overlap the second active layer 301 of the second transistor 30 as the oxide semiconductor transistor, such that the shielding layer 40 may cover all the second active layers 301, and then may protect all the second active layers 30 in the pixel circuit 50.

Figure 18:
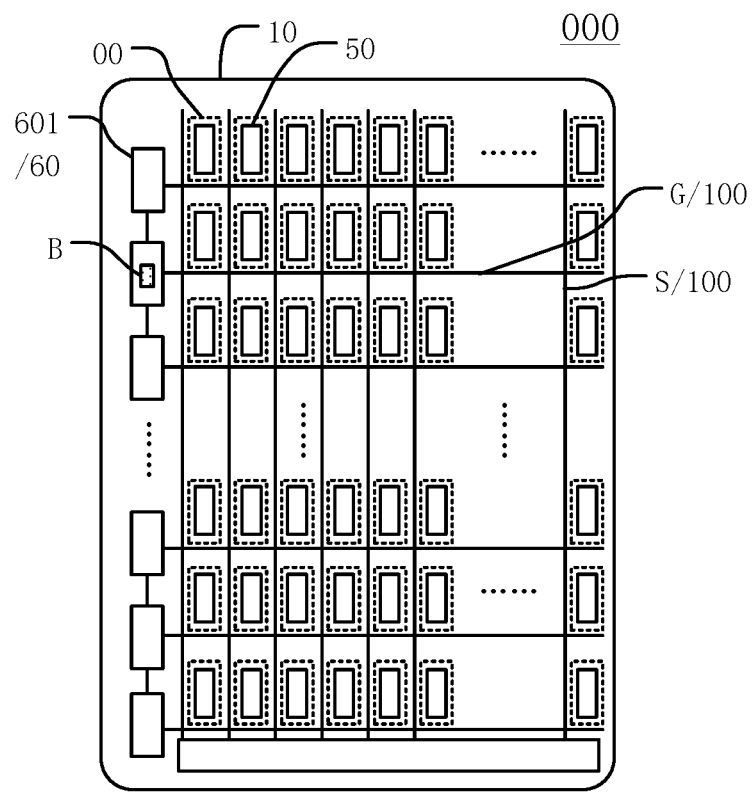
FIG. 18 illustrates a schematic top view of another exemplary display panel consistent with disclosed embodiments of the present disclosure.

FIG. 18 illustrates a schematic local top-view of another display panel consistent with disclosed embodiments of the present disclosure. In certain embodiments, referring to FIGS. 1-2 and FIG. 18, the driving circuit 60 may include at least one-level shift register 601 (illustrated as a block diagram in FIG. 18, and in view of this, FIG. 2 illustrates a schematic local cross-sectional view of film layers of a region B in FIG. 18). The shift register 601 may include a first transistor 20 and a second transistor 30.

Along the projection direction Z perpendicular to the base substrate 10, the shielding layer 40 may fully cover the second active layer 301 of the second transistor 30 in the shift register 601.

The disclosed embodiments may explain that the display panel 000 may include the driving circuit 60, and the driving circuit 60 may be a gate driving circuit. The driving circuit 60 may include at least one-level shift register 601. An output terminal of the shift register 601 may be electrically connected to the scanning signal line G of the display panel 000, and may be configured to provide a scanning driving signal for the sub-pixel 00 of the display panel 000.

In one embodiment, when the driving circuit 60 includes the second transistor 30 as an oxide semiconductor transistor, along the projection direction Z perpendicular to the base substrate 10, the shielding layer 40 may fully cover the second active layer 301 of the second transistor 30 in the shift register 601. Therefore, by fully covering the second active layer 301 of the second transistor 30 as the oxide semiconductor transistor with the shielding layer 40, the H elements in the organic layer and the encapsulation layer over the shielding layer 40 may be prevented from diffusing into the second transistor 30, thereby avoiding damaging the second transistor 30, which may facilitate to improve the driving effect of the driving circuit 60 of the display panel 000.

It should be noted that for illustrative purposes, the driving circuit 60 may be a gate driving circuit as an example, which may not be limited to this. The driving circuit 60 may be any other circuit, such as a source driving circuit, etc., as long as when the driving circuit 60 includes the first transistor 20 and the second transistor 30, along the projection direction Z perpendicular to the base substrate 10, the shielding layer 40 may be capable of fully covering the second active layers 301 of all the second transistors 30 in the driving circuit 60.

Figure 19:
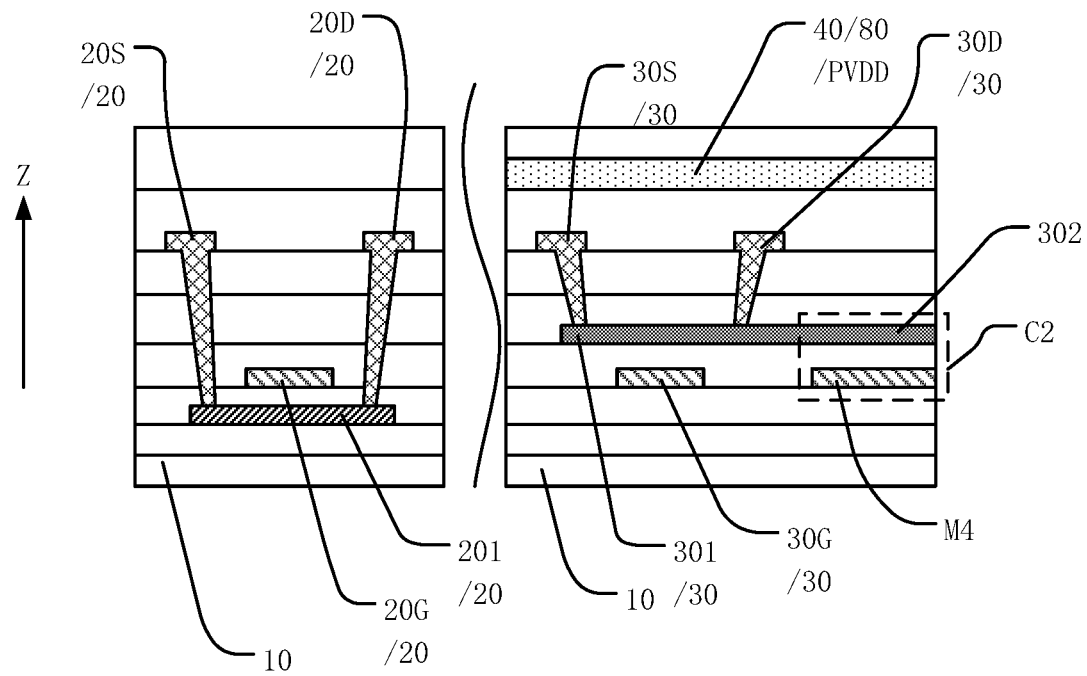
FIG. 19 illustrates a local cross-sectional view of film layers of a region A of another exemplary display panel in FIG. 1 consistent with disclosed embodiments of the present disclosure.
Figure 20:
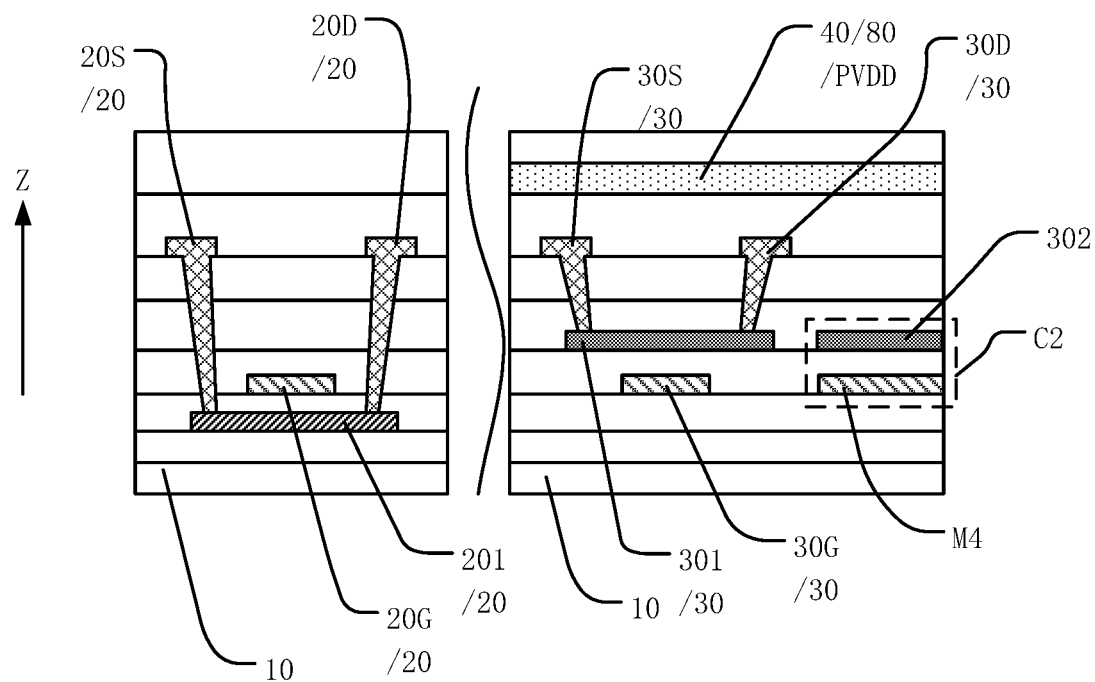
FIG. 20 illustrates a local cross-sectional view of film layers of a region A of another exemplary display panel in FIG. 1 consistent with disclosed embodiments of the present disclosure.
Figure 21:
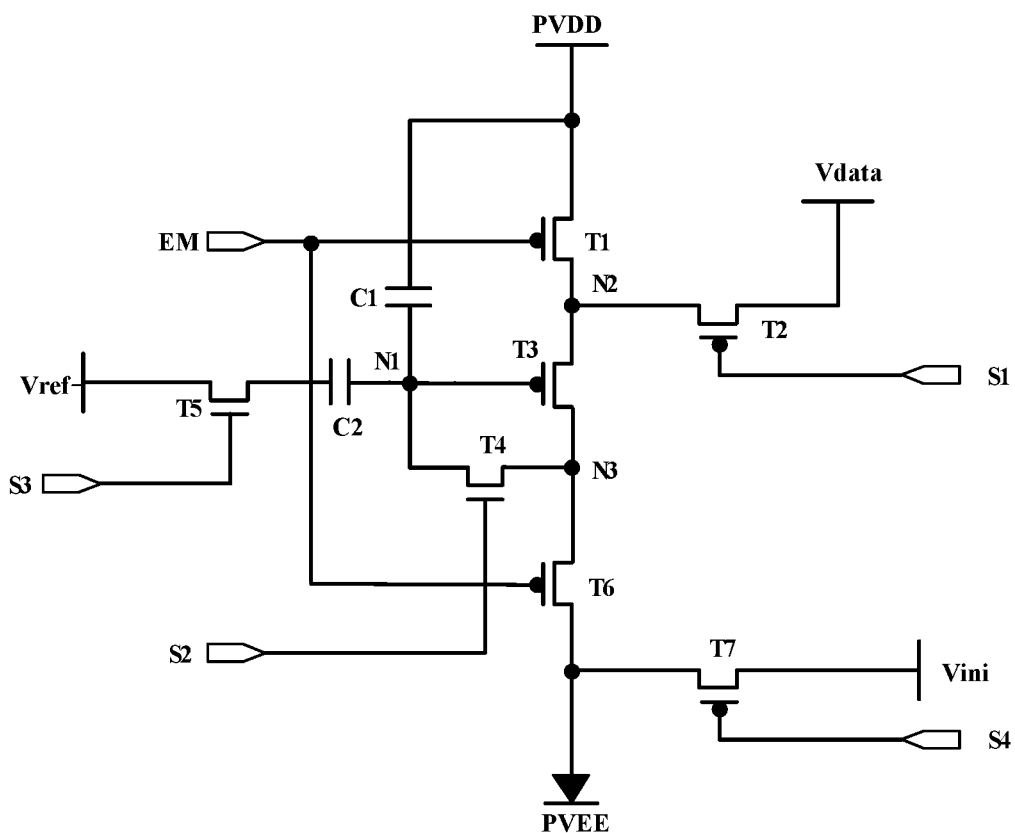
FIG. 21 illustrates a schematic diagram of a connection structure of another pixel circuit consistent with disclosed embodiments of the present disclosure.
Figure 22:
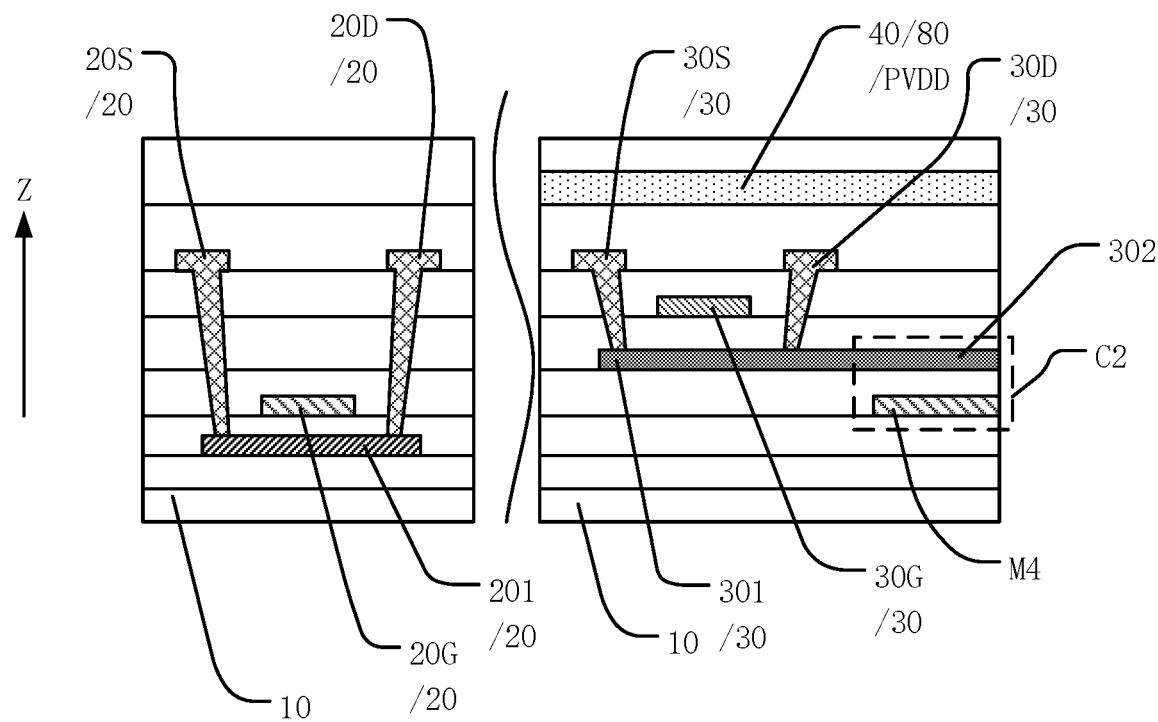
FIG. 22 illustrates a local cross-sectional view of film layers of a region A of another exemplary display panel in FIG. 1 consistent with disclosed embodiments of the present disclosure.
Figure 23:
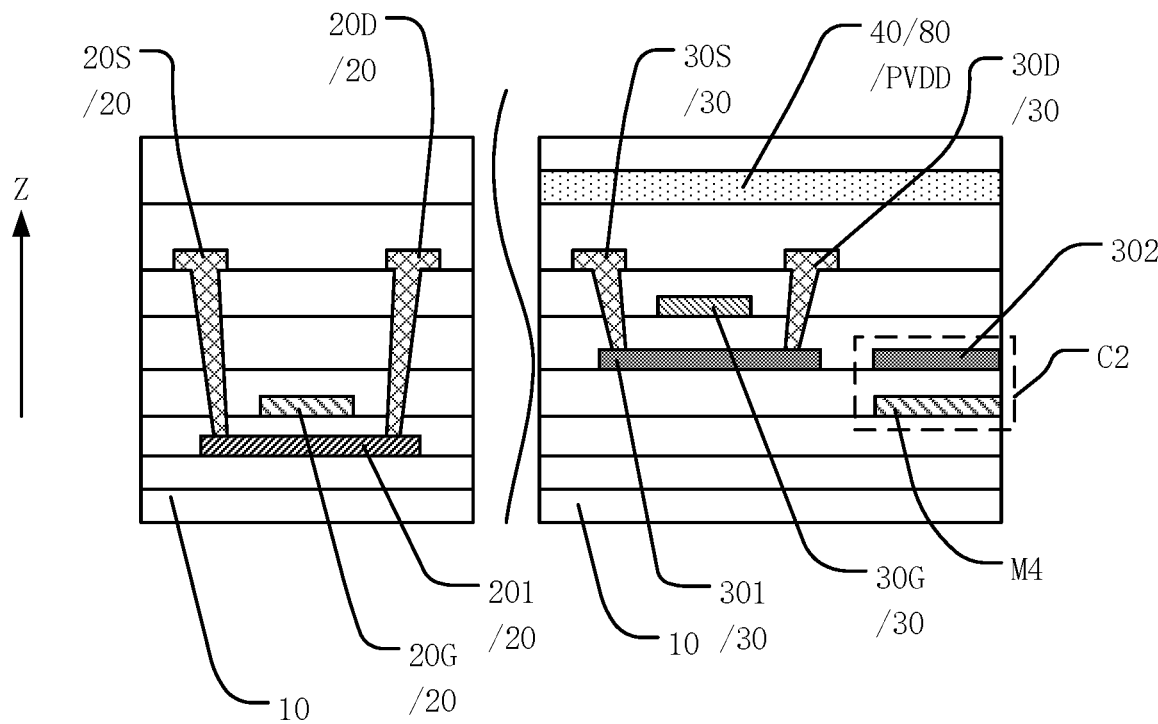
FIG. 23 illustrates a local cross-sectional view of film layers of a region A of another exemplary display panel in FIG. 1 consistent with disclosed embodiments of the present disclosure.

FIG. 19 illustrates another local cross-sectional view of film layers of the region A of the display panel in FIG. 1; FIG. 20 illustrates another local cross-sectional view of film layers of the region A of the display panel in FIG. 1; FIG. 21 illustrates a schematic diagram of a connection structure of another pixel circuit consistent with disclosed embodiments of the present disclosure; FIG. 22 illustrates another local cross-sectional view of film layers of the region A of the display panel in FIG. 1; and FIG. 23 illustrates another local cross-sectional view of film layers of the region A of the display panel in FIG. 1. In certain embodiments, referring to FIG. 1 and FIGS. 19-23, the display panel 000 may further include a first extension portion 302. The first extension portion 302 may be disposed in a same layer and made of a same material as the second active layer 301. Along the projection direction Z perpendicular to the base substrate 10, the shielding layer 40 may fully cover the first extension portion 302.

Optionally, the display panel 000 may include a fourth metal layer M4, and the fourth metal layer M4 may be disposed on the side of the second active layer 301 adjacent to the base substrate 10. The first extension portion 302 may overlap the fourth metal layer M4 to form a capacitor C2.

The disclosed embodiments may explain that in the display panel 000, the first extension portion 302 may be disposed in a same layer as the second active layer 302 of the second transistor 30. Optionally, the first extension portion 302 may be connected to the second active layer 301 without disconnection (as shown in FIG. 19), which may simplify the manufacturing process. Alternatively, the first extension portion 302 may be independent from and may not be connected to the second active layer 301 (as shown in FIG. 20), and, thus, the first extension portion 302 and the second active layer 301 may have independent conductive performance. For illustrative purposes, the pixel circuit 50 may be a pixel circuit with 7T1C (as shown in FIG. 21) as an example, and the pixel circuit may include a first transistor 20 and a second transistor 30. The first transistor 20 as the silicon transistor may have high mobility and desired stability, and may be used as the transistor T3, the transistor T1, the transistor T2, the transistor T6, and the transistor T7 in the pixel circuit. The second transistor 30 as the oxide semiconductor transistor may have small leakage current in an off state, and may be used as the transistor T4 and the transistor T5 connected with the capacitor C1 in the pixel circuit, to maintain the voltage of the capacitor C1 stable and to achieve a low-frequency display.

The first extension portion 302 disposed in a same layer and made of a same material as the second active layer 301 may overlap the fourth metal layer M4 to form the auxiliary capacitor C2. The auxiliary capacitor C2 may be located between the transistors T5 and a node N1 of the pixel circuit 50. Because the source of the transistor T5 is connected to a reference voltage Vref of the reference signal line REF, the transistor T5 may be used as a reset transistor of the pixel circuit 50. In the present disclosure, the auxiliary capacitor C2 formed between the reset transistor T5 and the node N1 may facilitate to maintain the potential of the node N1. Moreover, along the projection direction Z perpendicular to the base substrate 10, the shielding layer 40 may fully cover the first extension portion 302, which may prevent the H elements in the organic layer and the encapsulation layer over the shielding layer 40 from diffusing into the first extension portion 302, thereby avoiding damaging the auxiliary capacitor C2, which may facilitate to improve the overall display effect of the display panel 000.

It should be understood that the fourth metal layer M4 that overlaps the first extension portion 302 to form the auxiliary capacitor C2 may be disposed on the side of the second active layer 301 adjacent to the base substrate 10. When the first transistor 20 is a transistor with a top-gate structure and the second transistor 30 is a transistor with a bottom-gate structure (as shown in FIGS. 19-20), the fourth metal layer M4 may be formed in a same layer and made of a same material as the second gate 30G of the second transistor 30 and the first gate 20G of the first transistor 20. When each of the first transistor 20 and the second transistor 30 is a transistor with a top-gate structure (as shown in FIGS. 22-23), the fourth metal layer M4 may be formed in a same layer and made of a same material as the first gate 20G of the first transistor 20.

Optionally, the first gate 20G of the first transistor 20 may be multiplexed as the fourth metal layer M4. The auxiliary capacitor C2 may be formed between the first extension portion 302 and the first gate 20G of the first transistor 20 multiplexed as the fourth metal layer M4, to facilitate to maintain the potential of the node N1 connected to the first gate 20G of the first transistor 20 (transistor T3 in FIG. 21). In view of this, the film layer where the second gate 30G of the second transistor 30 is located may be disposed on the side of the film layer where the second active layer 301 is located facing away from the fourth metal layer M4. Which metal conductive structure in the display panel 000 being disposed in the same layer as the fourth metal layer M4 may not be limited by the present disclosure, as long as the fourth metal layer M4 is disposed on the side of the second active layer 301 adjacent to the base substrate 10 to overlap the first extension portion 302 to form the auxiliary capacitor C2.

Figure 24:
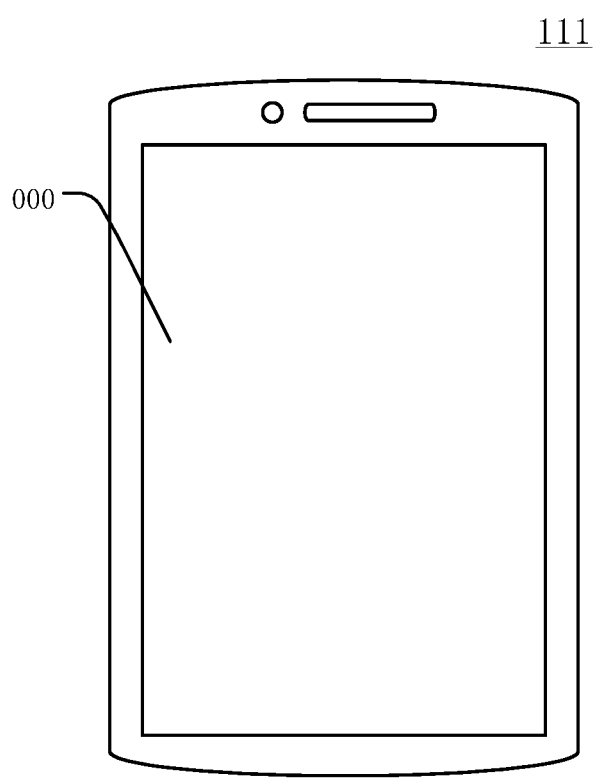
FIG. 24 illustrates a schematic top view of an exemplary display device consistent with disclosed embodiments of the present disclosure.

The present disclosure also provides a display device. FIG. 24 illustrates a schematic top view of a display device consistent with disclosed embodiments of the present disclosure. In one embodiment, referring to FIG. 24, the display device 111 may include the display panel 000 provided in the above-disclosed embodiments. For illustrative purposes, FIG. 24 illustrates a mobile phone as an example to describe the display device 111. The display device 111 may be a computer, a TV, a vehicle-mounted display device, or any other display device with a display function, which may not be limited by the present disclosure. The display device 111 in the present disclosure may have the beneficial effects of the display panel 000 in the present disclosure, which may refer to specific descriptions of the display panel 000 in the foregoing embodiments, and may not be repeated herein.

The display panel and display device in the present disclosure may at least include following beneficial effects. In the present disclosure, the display panel may include at least different types of the first transistor and the second transistor. The first transistor as the silicon transistor may have high mobility and desired stability, while the second transistor as the oxide semiconductor transistor may have a low leakage current in an off state. The oxide semiconductor transistor may have a carrier mobility 20-30 times than amorphous silicon transistor, which may greatly increase the charge and discharge rates of the transistor to the pixel electrode of the sub-pixel, may increase the response speed of the sub-pixel, and may achieve a substantially fast refresh rate. At the same time, the substantially fast response may greatly improve the line scan rate of the pixel, making ultra-high resolution possible.

The first transistor may be a silicon transistor, and the second transistor may be an oxide semiconductor transistor. With respect to the second transistor as the oxide semiconductor transistor, the silicon transistor may be less sensitive to hydrogen (H) element, water, oxygen, etc. in the external environment. In other words, the second active layer of the second transistor may contain oxide semiconductor including a metal material, which may be substantially sensitive to the H element. In the manufacturing process of the display panel, after the second transistor is formed, a plurality of insulating layers and an encapsulation layer may be further formed over the second transistor. The insulating layer and the encapsulation layer may contain a material such as silicon nitride and an organic material. Both the material such as silicon nitride and the organic material may contain a substantially large amount of H elements. As time changes, H elements may easily diffuse into the second transistor, such that the second transistor may be corroded and fail, thereby affecting the display quality.

The shielding layer may be formed over the base substrate of the display panel. The shielding layer may be disposed on a side of the first active layer facing away from the base substrate, and may be disposed on a side of the second active layer facing away from the base substrate. Along the projection direction perpendicular to the base substrate, the shielding layer may fully cover the second active layer. In other words, the second active layer of the second transistor as the oxide semiconductor transistor may be fully covered by the shielding layer. Therefore, the H elements in the organic layer and the encapsulation layer over the shielding layer may be prevented from diffusing into the second transistor, which may avoid damaging the second transistor, and may facilitate to improve the overall display effect of the display panel.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
a base substrate;
a driving circuit, one or more pixel circuits, and one or more light-emitting elements;
one or more first transistors and one or more second transistors over the base substrate, wherein:
    a first transistor of the one or more first transistors includes a first active layer, and the first active layer contains silicon, and
    a second transistor of the one or more second transistors includes a second active layer, and the second active layer contains an oxide semiconductor material; and
a shielding layer, wherein the shielding layer is disposed on a side of the first active layer facing away from the base substrate, and is disposed on a side of the second active layer facing away from the base substrate, wherein:
    along a projection direction perpendicular to the base substrate, the shielding layer covers the second active layer; and
    a pixel circuit of the one or more pixel circuits includes a first region and a second region, the first region and the second region are arranged along a first direction, the first region includes a second transistor of the one or more second transistors, and the second region does not include a second transistor, wherein:
        the shield layer extends along the first direction and passes over both the first region and the second region of the pixel circuit; and
        along a second direction perpendicular to the first direction, a width of the shielding layer over the first region is greater than a width of the shielding layer over the second region, wherein the shield layer over the first region and the shield layer over the second region is a block without a void structure and the shield layer over the first region and the shield layer over the second region are directly adjacent to each other.

2. The display panel according to claim 1, wherein:
the driving circuit provides driving signals to the one or more pixel circuits, the pixel circuit of the one or more pixel circuits provides a driving current to a light-emitting element of the one or more light-emitting elements, and the first transistor and the second transistor are located in the driving circuit or the pixel circuit, wherein:
the first transistor includes a first gate, a first source, and a first drain,
the second transistor includes a second gate, a second source, and a second drain, and
the shielding layer is disposed on a side of a film layer including the second source and the second drain, facing away from the base substrate.

3. The display panel according to claim 2, further including:
a first power signal line, configured to provide a first power signal to the pixel circuit, wherein the first power signal is applied on the shielding layer.

4. The display panel according to claim 2, further including:
a first power signal line, configured to provide a first power signal to the pixel circuit, wherein:
the first power signal line is disposed in a first metal layer, the shielding layer is disposed in a second metal layer, and the second metal layer is disposed on a side of the first metal layer facing away from the base substrate, and the first power signal line is connected to the shielding layer through a via.

5. The display panel according to claim 4, wherein:
the display panel includes a first driving signal line, wherein the first driving signal line is disposed in the first metal layer or a third metal layer, and the third metal layer is disposed on a side of the first metal layer adjacent to the base substrate; and
the pixel circuit includes at least one second transistor of the one or more second transistors, and the first driving signal line is connected to at least one of the second source, the second drain, and the second gate of the second transistor, and is configured to provide a first driving signal to the second transistor, or to control turn-on and turn-off of the second transistor through the first driving signal, wherein:
the shielding layer overlaps at least a portion of the first driving signal line.

6. The display panel according to claim 5, wherein:
the pixel circuit of the one or more pixel circuits includes at least one second transistor of the one or more second transistors; and
the shielding layer includes a plurality of shielding regions, one shielding region of the plurality of shielding regions at least covers a second transistor of the at least one second transistor in the pixel circuit of the one or more pixel circuits, adjacent shielding regions are arranged along a third direction, and an interval between the adjacent shielding regions is extended along a fourth direction, wherein:
the first driving signal line is extended along the fourth direction, along the projection direction perpendicular to the base substrate, the first driving signal line overlaps the interval between the adjacent shielding regions, and
the third direction is perpendicular to the fourth direction.

7. The display panel according to claim 6, wherein:
one shielding region at least corresponds to all of the at least one second transistor in the one pixel circuit.

8. The display panel according to claim 6, wherein:
the adjacent shielding regions are electrically connected to each other through the first metal layer.

9. The display panel according to claim 6, wherein:
the adjacent shielding regions are electrically connected to each other through a first auxiliary line, wherein the shielding layer and the first auxiliary line are disposed in the second metal layer.

10. The display panel according to claim 4, wherein:
the shielding layer includes a plurality of hollowed regions, a hollowed region of the plurality of hollowed regions at least partially overlaps the first driving signal line, and in an overlapped region, a width of the hollowed region is greater than a width of the first driving signal line.

11. The display panel according to claim 5, wherein:
the first driving signal line is one of a data signal line, a scanning signal line, and a reference signal line.

12. The display panel according to claim 2, wherein:
one pixel circuit includes at least one first transistor of the one or more first transistors and at least one second transistor of the one or more second transistors; and
along the projection direction perpendicular to the base substrate, the shielding layer covers the second active layer of the at least one second transistor in the pixel circuit, and does not fully overlap the first active layer of the at least one first transistor in the pixel circuit.

13. The display panel according to claim 3, wherein:
the driving circuit includes at least one-level shift register, and a shift register of the at least one-level shift register includes the first transistor and the second transistor, wherein:
along the projection direction perpendicular to the base substrate, the shielding layer covers the second active layer of the second transistor in the shift register.

14. A display panel, comprising:
a base substrate;
one or more first transistors and one or more second transistors over the base substrate, wherein:
a first transistor of the one or more first transistors includes a first active layer, and the first active layer contains silicon,
a second transistor of the one or more second transistors includes a second active layer, and the second active layer contains an oxide semiconductor material,
a shielding layer, wherein the shielding layer is disposed on a side of the first active layer facing away from the base substrate, and is disposed on a side of the second active layer facing away from the base substrate, and along a projection direction perpendicular to the base substrate, the shielding layer covers the second active layer,
a first extension portion, disposed in a same layer and made of a same material as the second active layer of the second transistor, wherein the first extension portion is connected to the second active layer without disconnection or is independent from and not connected to the second active layer, and along the projection direction perpendicular to the base substrate, the shielding layer covers the first extension portion, and
a fourth metal layer, disposed on a side of the second active layer of the second transistor adjacent to the base substrate, wherein the first extension portion overlaps the fourth metal layer and the first extension portion together with the fourth metal layer form a capacitor.

15. The display panel according to claim 14, wherein:
the fourth metal layer is formed in a same layer and made of a same material as the first gate of the first transistor, or the first gate is multiplexed as the fourth metal layer.

16. A display device, comprising:
a display panel, wherein the display panel includes:
a base substrate;
one or more first transistors and one or more second transistors over the base substrate, wherein:
a first transistor of the one or more first transistors includes a first active layer, and the first active layer contains silicon, and
a second transistor of the one or more second transistors includes a second active layer, and the second active layer contains an oxide semiconductor material; and
a shielding layer, wherein the shielding layer is disposed on a side of the first active layer facing away from the base substrate, and is disposed on a side of the second active layer facing away from the base substrate, wherein:

along a projection direction perpendicular to the base substrate, the shielding layer covers the second active layer; and a pixel circuit of the one or more pixel circuits includes a first region and a second region, the first region and the second region are arranged along a first direction, the first region includes a second transistor of the one or more second transistors, and the second region does not include a second transistor, wherein:

the shield layer extends along the first direction and passes over both the first region and the second region of the pixel circuit; and along a second direction perpendicular to the first direction, a width of the shielding layer over the first region is greater than a width of the shielding layer over the second region, wherein each of the shield layer over the first region and the shield layer over the second region is a block without a void structure and the shield layer over the first region and the shield layer over the second region are directly adjacent to each other.

* * * * *